US009838626B2

(12) United States Patent
Nagai et al.

(10) Patent No.: US 9,838,626 B2
(45) Date of Patent: Dec. 5, 2017

(54) SEMICONDUCTOR APPARATUS, SOLID-STATE IMAGE SENSING APPARATUS, AND CAMERA SYSTEM

(71) Applicant: Sony Corporation, Tokyo (JP)

(72) Inventors: Toshiaki Nagai, Kanagawa (JP); Ken Koseki, Kanagawa (JP); Yosuke Ueno, Kanagawa (JP); Atsushi Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/630,608

(22) Filed: Jun. 22, 2017

(65) Prior Publication Data

US 2017/0288691 A1    Oct. 5, 2017

Related U.S. Application Data

(63) Continuation of application No. 15/414,028, filed on Jan. 24, 2017, now Pat. No. 9,736,409, which is a
(Continued)

(30) Foreign Application Priority Data

Oct. 21, 2011  (JP) .................................. 2011-232282

(51) Int. Cl.
*H04N 5/374* (2011.01)
*H04N 5/363* (2011.01)
(Continued)

(52) U.S. Cl.
CPC ....... *H04N 5/363* (2013.01); *H01L 27/14612* (2013.01); *H01L 27/14634* (2013.01);
(Continued)

(58) Field of Classification Search
CPC ...... H04N 5/2253; H04N 5/359; H04N 5/374; H04N 5/37457; H04N 5/378; H04N 27/14618; H04N 2924/0002
See application file for complete search history.

(56) References Cited

U.S. PATENT DOCUMENTS 4,792,849 A     12/1988  McCalley
2001/0040635 A1  11/2001  Fossum et al.
(Continued)

FOREIGN PATENT DOCUMENTS

EP    2234387 A1    9/2010
JP    2009-088901   4/2009
(Continued)

OTHER PUBLICATIONS

International Search Report; International Application No. PCT/JP2012/006497; dated Oct. 10, 2012.
(Continued)

*Primary Examiner* — Tuan Ho
(74) *Attorney, Agent, or Firm* — Michael Best & Friedrich LLP

(57) ABSTRACT

A semiconductor apparatus, a solid-state image sensing apparatus, and a camera system capable of reducing interference between signals transmitted through adjacent via holes, preventing an increase in the number of the via holes, reducing the area of a chip having sensors thereon and the number of mounting steps thereof. First and second chips are bonded together to form a laminated structure, a wiring between the first chip and the second chip being connected through via holes, the first chip transmitting signals obtained by time-discretizing analog signals generated by respective sensors to the second chip through the corresponding via holes, the second chip sampling the signals transmitted from the first chip through the via holes at a timing different from
(Continued)

a timing at which the signals are sampled by the first chip and quantizing the sampled signals to obtain digital signals.

30 Claims, 38 Drawing Sheets

Related U.S. Application Data continuation of application No. 15/264,272, filed on Sep. 13, 2016, now Pat. No. 9,654,708, which is a continuation of application No. 15/078,984, filed on Mar. 23, 2016, now Pat. No. 9,509,933, which is a continuation of application No. 14/348,722, filed as application No. PCT/JP2012/006497 on Oct. 10, 2012, now Pat. No. 9,350,929.

(51) Int. Cl.

| | | |
|---|---|---|
| *H03M 1/56* | (2006.01) | |
| *H03M 1/08* | (2006.01) | |
| *H03M 1/12* | (2006.01) | |
| *H04N 5/359* | (2011.01) | |
| *H04N 5/378* | (2011.01) | |
| *H04N 5/3745* | (2011.01) | |
| *H04N 5/225* | (2006.01) | |
| *H01L 27/146* | (2006.01) | |

(52) U.S. Cl.
CPC .. *H01L 27/14636* (2013.01); *H01L 27/14643* (2013.01); *H03M 1/08* (2013.01); *H03M 1/0863* (2013.01); *H03M 1/123* (2013.01); *H03M 1/56* (2013.01); *H04N 5/2253* (2013.01); *H04N 5/359* (2013.01); *H04N 5/374* (2013.01); *H04N 5/378* (2013.01); *H04N 5/37457* (2013.01); *H01L 27/14618* (2013.01); *H01L 2924/0002* (2013.01)

(56) References Cited

U.S. PATENT DOCUMENTS

| | | |
|---|---|---|
| 2004/0098178 A1 | 5/2004 | Brady |
| 2010/0020211 A1 | 1/2010 | Inada |
| 2010/0055896 A1 | 3/2010 | Abe et al. |
| 2010/0149385 A1* | 6/2010 | Tay ............... H01L 27/14603 348/241 |
| 2010/0276572 A1 | 11/2010 | Iwabuchi et al. |
| 2014/0211118 A1 | 7/2014 | Zhou et al. |
| 2015/0249107 A1 | 9/2015 | Baba |
| 2016/0360138 A1* | 12/2016 | Meynants ......... H01L 27/14609 |
| 2017/0214876 A1* | 7/2017 | Katagiri ............... H04N 5/378 |

FOREIGN PATENT DOCUMENTS

| | | |
|---|---|---|
| JP | 2009-170448 A | 7/2009 |
| JP | 2009-0177207 A | 8/2009 |
| JP | 2010-093641 | 4/2010 |
| JP | 2010-165854 A | 7/2010 |
| JP | 2010-0225927 A | 10/2010 |
| JP | 2011-129784 A | 6/2011 |
| JP | 2011-159958 | 8/2011 |
| JP | 2011-159958 A | 8/2011 |
| JP | 2013-0051674 A | 3/2013 |
| KR | 20080019652 A | 3/2008 |
| WO | WO-2006-129762 A1 | 7/2006 |
| WO | WO-2011/083722 | 7/2011 |

OTHER PUBLICATIONS

Extended European Search Report in connection with Application No. EP12840933 dated May 8, 2015.
Japanese Office Action dated Jan. 26, 2016, for corresponding Japanese Application No. 2011-232282.
Chinese Office Action dated Nov. 3, 2016 for corresponding Chinese Application No. 201280050495.8.
Korean Office Action dated Dec. 8, 2016 for corresponding Korean Application No. 10-2014-7009617.
Japanese Office Action dated Oct. 17, 2017 for corresponding Japanese Application No. 2016-235760.

\* cited by examiner

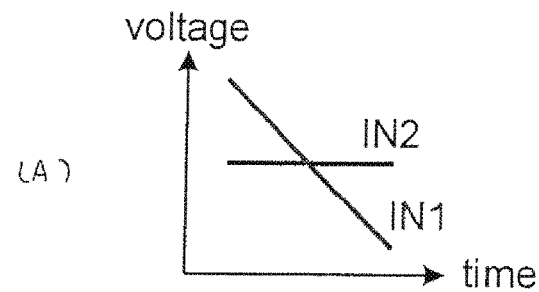
(A)
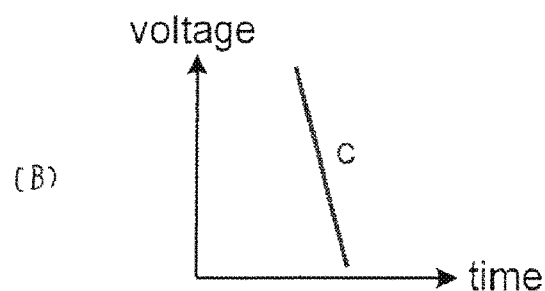
(B)
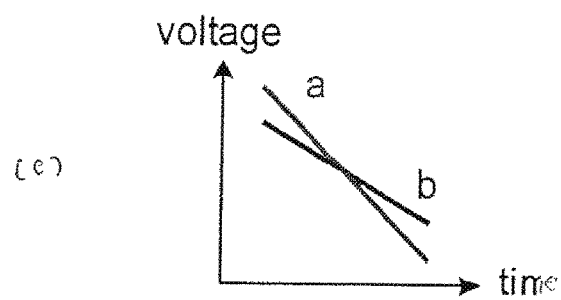
(C)
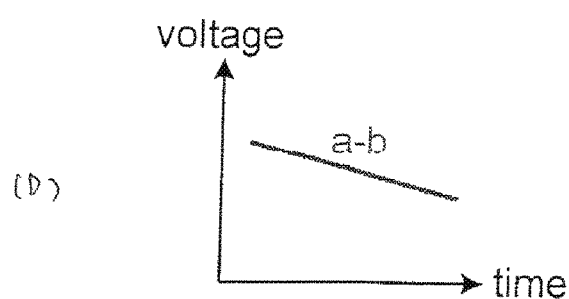
(D)
FIG.28

SEMICONDUCTOR APPARATUS, SOLID-STATE IMAGE SENSING APPARATUS, AND CAMERA SYSTEM

CROSS-REFERENCE TO RELATED APPLICATIONS

The present application is a Continuation of U.S. application Ser. No. 15/414,028, filed Jan. 24, 2017, which is a Continuation of U.S. application Ser. No. 15/264,272, filed Sep. 13, 2016, now U.S. Pat. No. 9,654,708, issued May 16, 2017, which is a Continuation of U.S. application Ser. No. 15/078,984, filed Mar. 23, 2016, now U.S. Pat. No. 9,509,933, issued on Nov. 29, 2016, which is a Continuation of U.S. application Ser. No. 14/348,722, filed Mar. 31, 2014, now U.S. Pat. No. 9,350,929, issued on May 24, 2016, which is a National Stage Application of PCT/JP/2012-006497, filed Oct. 10, 2012, which claims priority to Japanese Patent Application Number 2011-232282, filed in the Japanese Patent Office on Oct. 21, 2011, the entire disclosures of which are incorporated herein by reference in their entirety.

TECHNICAL FIELD

The present technology relates to a semiconductor apparatus having a structure where a plurality of sensors are arranged in array form, a solid-state image sensing apparatus, and a camera system.

BACKGROUND ART

For semiconductor apparatuses such as CMOS image sensors having a structure where a plurality of sensors are arranged in array form, there have been increased demands for highly-developed signal processing and miniaturization.

In order to realize this, Patent Document 1, for example, has proposed a method of laminating chips together to integrate a larger signal processing circuit having the same chip size as before.

Such a semiconductor apparatus has a laminated structure of a chip (hereinafter referred to as an analog chip) where a sensor array for generating analog signals is mounted and a chip (hereinafter referred to as a digital chip) where a logic circuit for signal processing is mounted.

Then, the semiconductor apparatus connects these chips together through TC(S)Vs (Through Contact (Silicon) VIAs) formed in the analog chip so as to be laminated one on the other, thereby realizing miniaturization.

A challenge for the miniaturization with such a method is to divide circuit blocks related to signal paths for flowing data output from the sensor array into the upper and lower chips.

For example, in an image sensor, the above system uses several thousand or more wirings for fetching signals from the sensor array so as to correspond to the number of pixels arranged in a vertical or horizontal direction.

For this reason, it is necessary to concentrate the TCVs so as to be placed into the paths. Accordingly, a change in the signal of one of the TCVs adjacent to the other of the TCVs with a large amplitude interferes with the signal of the target TCV and causes an error in the signal.

As countermeasures for this interference, the signals transmitted through the TCVs are limited to those (using one or more binary signal lines) quantized in a voltage direction in the related art.

Hereinafter, the countermeasures will be described in detail.

Hereinafter, as the first countermeasures, a description will be given of a case where the signals transmitted through the TCVs are time-discretized and quantized signals, i.e., digital signals. Then, as the second countermeasures, a description will be given of a case where the signals transmitted through the TCVs are continuous-time and quantized signals.

First, a description will be given of the countermeasures where the signals transmitted through the TCVs are time-discretized and quantized signals, i.e., digital signals.

FIG. 1 is a diagram showing a first configuration example where the signals transmitted through the TCVs are time-discretized and quantized signals in a semiconductor apparatus using laminated chips.

A semiconductor apparatus 1 has a laminated structure of an analog chip 2 and a digital chip 3.

Among the laminated chips, the analog chip 2 of the semiconductor apparatus 1 manufactured according to an analog process has a plurality of sensors 4(-0, -1, . . . ) arranged in array form.

The outputs of the sensors 4 are connected to sampling switches 6(-0, -1, . . . ) for time-discretizing signals through amplifiers 5(-0, -1, . . . ).

Here, if the power of the signals output from the sensors 4 is substantially large, the outputs of the sensors 4 may be directly connected to the sampling switches without passing through the amplifiers.

The signals time-discretized by the sampling switches 6 are quantized in a voltage direction using quantizers 7(-0, -1, . . . ).

The quantizers 7 are composed of a plurality of comparators, and each of the comparators compares a certain signal level with an input signal level to quantize the signal.

Here, the quantizers 7 do not have to complete the quantization at a time but may be circuits configured to perform a plurality of stages.

The signals digitized in such a process are transmitted to the digital chip 3 through TCVs 8(-0, -1, . . . ) and then processed by a digital signal processing circuit 9.

In this case, the signals transmitted through the TCVs 8 are binary signals of a power supply level or a ground (GND) level, and no error is caused in the signals unless the signals are reduced in size to about the half of a power supply voltage. Further, even if the parasitic capacitances of the TCVs 8 cause a delay in the signals, no problem occurs within the setup margin of the signal processing circuit 9.

Next, a description will be given of another configuration example where the signals transmitted through the TCVs are digital signals.

FIG. 2 is a diagram showing a second configuration example where the signals transmitted through the TCVs are time-discretized and quantized signals in a semiconductor apparatus using laminated chips.

In this case, in a semiconductor apparatus 1A, the output signals of sensors 4 are not directly time-discretized by the sampling switches 6 but are time-discretized by SH (sample hold) circuits 10(-0, -1, . . . ) provided near the sensors 4.

The SH circuits 10 can be realized by only switches and capacitances in the simplest way.

Next, a description will be given of a case where the configuration example shown in FIG. 2 where the signals transmitted through the TCVs are digital signals is applied to an image sensor.

FIG. 3 is a diagram showing a third configuration example where the signals transmitted through the TCVs are time-discretized and quantized signals in a semiconductor apparatus using laminated chips and is a diagram showing an example where the configuration example shown in FIG. 2 is applied to a CMOS image sensor.

Note that in FIG. 3, the same constituents as those of FIGS. 1 and 2 are denoted by the same symbols to facilitate the understanding of the third configuration example.

Mainstream CMOS image sensors have a FD (Floating Diffusion) amplifier for every pixel and are of a column-parallel output type that selects certain rows in a pixel array and simultaneously reads them in a column direction.

This is because parallel processing is advantageous due to the fact that the FD amplifiers arranged in the pixels hardly provide satisfactory driving performance and thus a data rate has to be reduced.

Such a CMOS image sensor 20 is configured to include a pixel array part 21 serving as a sensor array and a row selection circuit (V scanner) 22 that drives pixels.

The pixel array part 21 has pixel circuits 30 arranged in M (rows)×N (columns) matrix form.

The row selection circuit 22 controls the operations of the pixels arranged in any rows of the pixel array part 21. The row selection circuit 22 controls the pixels through control lines LSEL, LRST, and LTRG.

As an example, FIG. 3 shows a case where each of the pixel circuits 30 includes four transistors.

The pixel circuit 30 has a photoelectric conversion element (hereinafter simply referred to as a PD when necessary) 31 composed of, for example, a photodiode (PD). With respect to the one photoelectric conversion element 31, the pixel circuit 30 has four transistors serving as active elements, i.e., a transfer transistor 32, a reset transistor 33, an amplification transistor 34, and a selection transistor 35.

In the CMOS image sensor 20, FDs (Floating Diffusions) (capacitances) and the transfer transistors (transfer switches) 32 realize the function of the sample hold circuits shown in the block diagram of FIG. 2 with respect to the photoelectric conversion elements (photodiodes) 31 serving as sensors.

Second, a description will be given of a case where the signals transmitted through the TCVs are continuous-time and quantized signals.

FIG. 4 is a diagram showing a first configuration example where the signals transmitted through the TCVs are continuous-time and quantized signals in a semiconductor apparatus using laminated chips.

As in the case of the semiconductor apparatus 1A shown in FIG. 2, a semiconductor apparatus 1C shown in FIG. 4 causes comparators 23(-0, -1, . . . ) to compare signals discretized by the SH circuit 10 with ramp waves generated by a ramp signal generator (not shown), thereby converting analog signals output from the sensors 4 into time-axis signals.

The semiconductor apparatus 1C transmits the quantized sensor signals thus converted to the digital chip 2C through the TCVs 8 and quantizes the time-axis information with counters (TDCs: Time to Digital Converters) 24, thereby obtaining digital signals.

FIG. 5 is a diagram where the above operations are shown using waveforms in a time axis.

When the comparison results of the analog signals and ramp waves RAMP are output from the comparators 23 as signals S23, the counters 24 stop their counting operations and the signals are determined. Here, a timing for starting the ramp waves RAMP and a timing for starting the counting operations with the counters 24 are synchronized with each other. With this operation, voltage information is converted into time information.

When such a transmitting method is used, the signals transmitted through the TCVs 8 are quantized to a power supply level or a ground (GND) level as in a case where digital signals are transmitted.

FIG. 6 is a diagram showing an example where the configuration shown in FIG. 4 is applied to a CMOS image sensor in a semiconductor apparatus using laminated chips.

Note that in FIG. 6, the same constituents as those of FIGS. 3 and 4 are denoted by the same symbols to facilitate the understanding of the semiconductor apparatus.

As in the case of FIG. 4, the semiconductor apparatus causes the comparators 23(-0, -1, . . . ) to perform the comparison of ramp waves generated by a ramp signal generator 25, thereby converting analog signals output from pixels 30 into time-axis signals.

The semiconductor apparatus transmits the quantized sensor signals thus converted to a digital chip 3D through the TCVs 8, quantizes the time-axis information with the counters (TDCs) 24, and stores obtained digital signals in latches (memories) 26.

The digital signals stored in the latches 26 are horizontally transferred through transfer lines by the signal processing circuit 9.

Note that the comparators 23, the counters 24, and the latches 26 arranged in respective columns form a so-called single slope AD converter (ADC).

FIG. 7 is a diagram showing the configuration of a general single slope AD converter.

A single slope AD converter 40 shown in FIG. 7 is configured to include a comparator 41, a counter 42, and a ramp signal generator 43.

As described above, in the single slope AD converter 40, the comparator 41 compares ramp waves (slope signal) generated by the ramp signal generator 43 such as a DAC with an input signal IN input to the AD converter 40 to control the subsequent-stage counter 42, thereby performing AD conversion.

As a significant performance index of the AD converter 40, noise characteristics are known. The noise characteristics of the comparator 41 often dominate the noise characteristics of the AD converter 40. Examples of noise include thermal noise serving as wide-band noise, flicker noise serving as low-frequency noise, RTS (Random-Telegraph-Signal) noise, or the like, each of which degrades the noise characteristics.

As the methods of reducing such noise, an increase in the sizes of transistors and the arrangement of mirror capacitances at the first-stage outputs of comparators (see Patent Document 2) have been generally known.

CITATION LIST

Patent Document

Patent Document 1: Japanese Patent Laid-open No. 2011-159958
Patent Document 2: Japanese Patent Laid-open No. 2010-93641

DISCLOSURE OF THE INVENTION

Problem to be Solved by the Invention

However, the cases where the signals transmitted through the TCVs are the digital signals as shown in FIGS. 1 to 3 cause the following problems.

The first problem is that the enhancement of the resolution of the quantizers results in an increase in the number of the TCVs.

As described above, it is general that about several thousand sensors (pixels) are simultaneously read in the image sensor. In the case where the countermeasures are performed, the TCVs obtained by multiplying several thousands by resolution (bit numbers) have to be provided, which results in an increase in excessive area and cost.

The second problem is that the signals transmitted through the TCVs have a large amplitude. Accordingly, the TCVs having a larger parasitic capacitance than normal via holes (VIA holes) have to be charged at a large signal amplitude, which results in an increase in power and power supply noise.

The third problem is that the areas of the quantizers per se become large. In order to realize the sensors, the analog chips are generally manufactured in a process having a peculiar step compared with the digital chips, which results in an increase in cost per area. Accordingly, an increase in the areas of the analog chips largely affects cost.

Meanwhile, the cases where the signals transmitted through the TCVs are the continuous-time and quantized signals as shown in FIGS. 4 and 6 cause the following problems.

The first problem is that the adjacent TCVs interfere with the signals. Because the signals transmitted through the TCVs are binary signals of a power supply level or a GND level, the TCVs are likely to interfere with the adjacent signals.

In this system, the signals withstand the interference from the adjacent TCVs when the outputs of the comparators are substantially stable and close to either a power supply level or a GND level. On the other hand, the signals are susceptible to the interference from the adjacent TCVs when the outputs of the comparators are being changed.

This is because the outputs of the comparators have finite rising time and the overlap of noise with the signals causes an error when the outputs exceed a certain level.

FIG. 8 is a diagram showing the influence of the error caused when the adjacent TCVs interfere with the signals.

If no interference from the adjacent TCVs occurs, outputs CMOUT of the comparators are those as indicated by dashed lines. On the other hand, if the interference from the adjacent TCVs occurs, the outputs CMOUT of the comparators are those as indicated by a solid line. An error ER is caused when the dashed lines and the solid line exceed a threshold VTH of the counters.

In this system, because the timing at which the signals of the comparators rise is changed depending on the level of the outputs of the sensors even if the timings of signals CLK 1 for driving the SH circuits are the same, it is difficult to manage the signals at the same timing.

In addition, from the reason above, the error is caused when the outputs of the adjacent comparators are changed at almost the same time. Therefore, even if the timings of the signals are synchronized with each other, the interference from the adjacent TCVs cannot be prevented in principle.

The arrangement of a shield between the TCVs can alleviate this problem but increases the distance between the TCVs, which results in an increase in the areas of the chips.

The second problem is that the increased output signals of the comparators result in an increase in power and power supply noise. The increase in power and power supply noise is caused by the same reason as the case where digital signals are transmitted.

The third problem is that the areas of the comparators per se result in an increase in cost as in the case where digital signals are transmitted. As compared with the case where digital signals are transmitted, only one comparison is performed and the circuits are simple. Accordingly, an increase in cost is smaller compared with a case where the quantizers of high resolution are used. However, in terms of the number of the comparators, the several thousand comparators have to be provided like the TCVs, which is unable to be disregarded.

As described above, in the semiconductor apparatuses that have the laminated structure and process the signals output from the sensors, the quantization at a voltage level has been performed in order to prevent the adjacent TCVs from interfering with the signals.

Then, any of the mounting methods described above increases the areas of the analog chips having many manufacturing steps, which results in an increase in cost and the amplitude of the signals transmitted through the TCVs. Therefore, an increase in power and power supply noise becomes a problem.

Moreover, in view of the semiconductor apparatus using the single slope AD converters, the increase in the sizes of the transistors as the method of reducing noise also increases parasitic capacitances as a side effect, which results in an increase in the areas of the circuits and a decrease in operating speed. Therefore, problems such as an increase in the area of each of the comparators and the limitation of an operating speed occur. In addition, due to these constraints, it is difficult to obtain a certain noise reduction effect.

Also in the method of arranging the mirror capacitances at the first-stage outputs of the comparators, because it is basically a method of reducing a noise band, i.e., a noise operating band, and thus an operating speed is reduced. Therefore, it is difficult to obtain a certain noise reduction effect.

Further, due to the principle that noise is reduced by the limitation of a band, this method has a problem of being not effective for low-frequency noise such as flicker noise and RTS noise.

Under these circumstances, it has been long expected to further reduce noise, particularly low-frequency noise in the comparators.

The present technology has been made to provide a semiconductor apparatus, a solid-state image sensing apparatus, and a camera system capable of reducing interference between signals transmitted through adjacent via holes, preventing an increase in the number of the via holes, reducing the area of a chip having sensors thereon and the number of mounting steps thereof, and eventually reducing cost.

Means for Solving the Problem

A semiconductor apparatus according to a first aspect of the present technology includes a first chip having a plurality of sensors arranged in array form and a second chip, the first chip and the second chip being bonded together to form a laminated structure, a wiring between the first chip and the second chip being connected through via holes, the first chip transmitting signals obtained by time-discretizing analog signals generated by the respective sensors to the second chip through the corresponding via holes, the second chip having a function of sampling the signals transmitted from the first chip through the via holes at a timing different from a timing at which the signals are sampled by the first chip and a function of quantizing the sampled signals to obtain digital signals.

A solid-state image sensing apparatus according to a second aspect of the present technology includes a pixel array part and a pixel signal reading part, the pixel array part having a plurality of pixels arranged in matrix form, the pixels performing photoelectric conversion, the pixel signal reading part reading time-discretized pixel signals in units of the plurality of pixels from the pixel array part, the pixel signal reading part having a plurality of comparators, a plurality of counters, a first chip, and a second chip, the plurality of comparators being arranged corresponding to an arrangement of columns of the pixels, comparing a reading signal potential with a ramp signal, and outputting signals based on the comparison result, the operations of the plurality of counters being controlled by outputs of the comparators, the counters counting comparison times of the corresponding comparators to perform quantization, the first chip and the second chip being bonded together to form a laminated structure, the first chip having the pixel array part and signal lines that transmit time-discretized analog pixel signals, the second chip having the pixel signal reading part, the first chip and the second chip having a wiring connected therebetween through via holes.

A camera system according to a third aspect of the present technology includes a solid-state image sensing apparatus and an optical system that forms a subject image on the solid-state image sensing apparatus, the solid-state image sensing apparatus including a pixel array part and a pixel signal reading part, the pixel array part having a plurality of pixels arranged in matrix form, the pixels performing photoelectric conversion, the pixel signal reading part reading time-discretized pixel signals in units of the plurality of pixels from the pixel array part, the pixel signal reading part having a plurality of comparators, a plurality of counters, a first chip, and a second chip, the plurality of comparators being arranged corresponding to an arrangement of columns of the pixels, comparing a reading signal potential with a ramp signal, and outputting signals based on the comparison result, the operations of the plurality of counters being controlled by outputs of the comparators, the counters counting comparison times of the corresponding comparators to perform quantization, the first chip and the second chip being bonded together to form a laminated structure, the first chip having the pixel array part and signal lines that transmit time-discretized analog pixel signals, the second chip having the pixel signal reading part, the first chip and the second chip having a wiring connected therebetween through via holes.

BRIEF DESCRIPTION OF DRAWINGS

FIG. 28 Diagrams showing the parasitic capacitance and the waveforms of the nodes generated when the slope signal is input in the configuration example shown in FIG. 27.

MODE(S) FOR CARRYING OUT THE INVENTION

Hereinafter, a description will be given of an embodiment of the present technology with reference to the drawings.

Note that the description will be given in the following order.
1. Outline of Semiconductor Apparatus
1.1 First Arrangement Configuration Example in Semiconductor Apparatus
1.2 Second Arrangement Configuration Example in Semiconductor Apparatus
1.3 Third Arrangement Configuration Example in Semiconductor Apparatus
2. Outline of Solid-State Image Sensing Apparatus
2.1 Basic Configuration Example of Solid-State Image Sensing Apparatus
2.2 Configuration Example of Solid-State Image Sensing Apparatus Having Column-Parallel ADCs
2.3 First Arrangement Configuration Example in Solid-State Image Sensing Apparatus
2.4 Second Arrangement Configuration Example in Solid-State Image Sensing Apparatus
2.5 Second Arrangement Configuration Example in Solid-State Image Sensing Apparatus
3. Configuration Example of Comparator
3.1 Basic Configuration Example of Comparator
3.2 Basic Configuration Example of Comparator Capable of Reducing Low-Frequency Noise
3.3 Specific Circuit Configuration Example of Comparator Capable of Reducing Low-Frequency Noise
4. Configuration Example of Camera System
<1. Outline of Semiconductor Apparatus>

Figure 9:
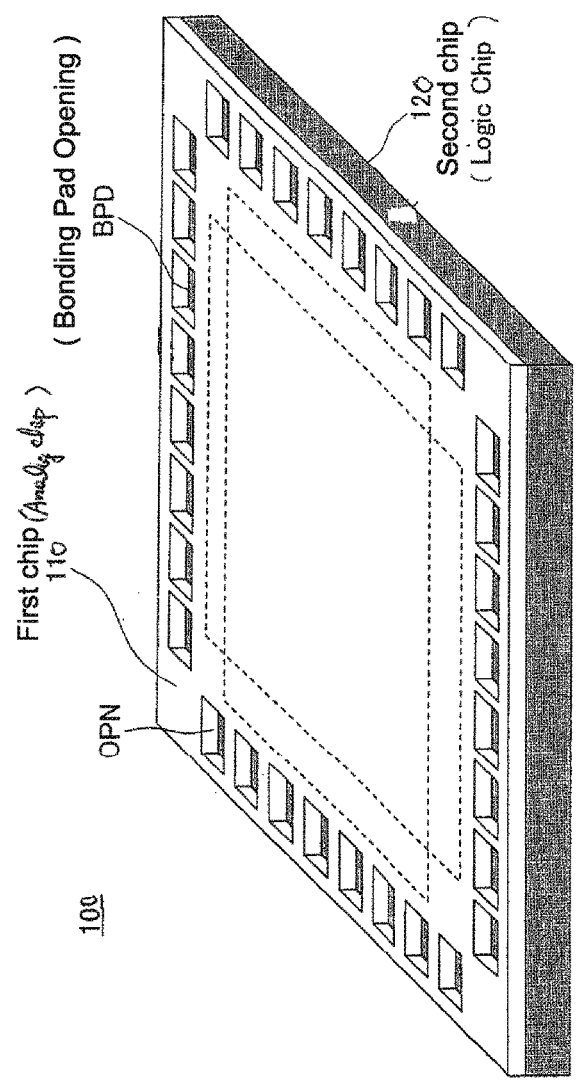
FIG. 9 A diagram showing an example of the laminated structure of a semiconductor apparatus according to an embodiment of the present technology.

FIG. 9 is a diagram showing an example of the laminated structure of a semiconductor apparatus according to the embodiment.

A semiconductor apparatus 100 according to the embodiment has a plurality of sensors arranged in array form and including photoelectric conversion elements and the like.

Hereinafter, a configuration example of the semiconductor apparatus having such a configuration will be first described. Then, a configuration example of a CMOS image sensor serving as a solid-state image sensing apparatus will be described as an example of the semiconductor apparatus. Further, a specific configuration example of a single slope AD converter having high noise reduction effect and applicable to the solid-state image sensing apparatus will be described.

As shown in FIG. 9, the semiconductor apparatus 100 has the laminated structure of a first chip (upper chip) 110 and a second chip (lower chip) 120.

The laminated first chip 110 and the second chip 120 are electrically connected to each other through via holes (TCVs) formed in the first chip 110.

The semiconductor apparatus 100 is formed to have the laminated structure in such a manner that the first and second chips 110 and 120 are bonded together at a wafer level and cut out by dicing.

In the laminated structure of the upper and lower two chips, the first chip 110 is formed of an analog chip (sensor chip) having the plurality of sensors arranged in array form.

The second chip 120 is formed of a logic chip (digital chip) including circuits that quantize analog signals transferred from the first chip 110 through the TCVs and a signal processing circuit.

The second chip 120 has a bonding pad BPD and an input/output circuit, and the first chip 110 has openings OPN for use in wire-bonding to the second chip 120.

Then, the semiconductor apparatus 100 of the laminated structure of the two chips according to the embodiment has the following characteristic configuration.

The electrical connection between the first chip 110 and the second chip 120 is performed through, for example, the via holes (TCVs).

The TCVs are arranged at chip ends or between the pad and a circuit region.

The TCVs for transmitting control signals and supplying power are mainly concentrated at, for example, the four corners of the chip, by which the signal wiring region of the first chip 110 can be reduced.

The reduction of the number of the wiring layers of the first chip 110 results in an increase in the resistance of a power source line and an increase in IR-Drop. As countermeasures for this problem, the effective arrangement of the TCVs can improve the noise control, stable supply, or the like of a power supply in the first chip 110 using the wiring of the second chip 120.

<1.1 First Arrangement Configuration Example in Semiconductor Apparatus>

Figure 10:
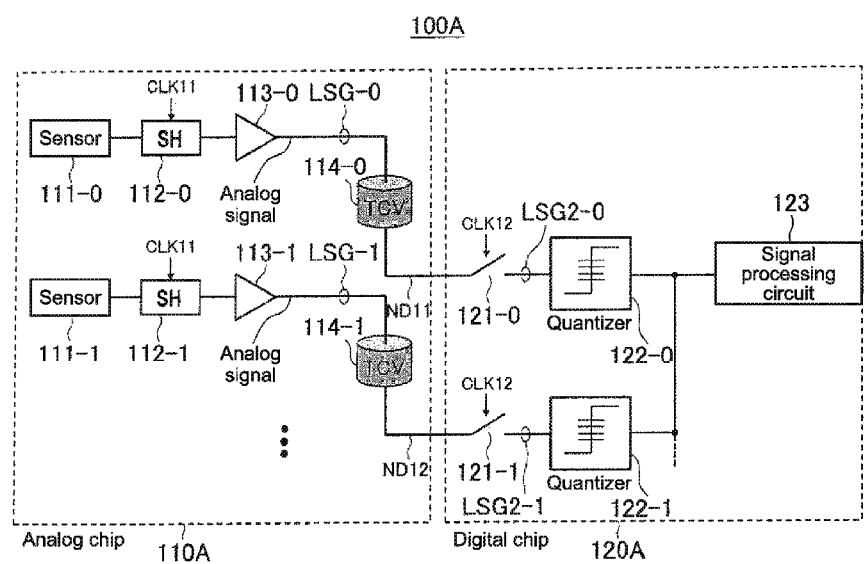
FIG. 10 A diagram showing a first arrangement configuration example of circuits or the like in the semiconductor apparatus according to the embodiment.

FIG. 10 is a diagram showing a first arrangement configuration example of circuits or the like in a semiconductor apparatus according to the embodiment.

In the semiconductor apparatus 100A shown in FIG. 10, a first chip 110A and a second chip 120A are two-dimensionally developed to facilitate the understanding of the arrangement of the circuits such as the first chip 110A and the second chip 120A of a laminated structure.

The first chip 110A has a plurality of sensors 111(-0, -1, . . . ) arranged in array form and first signal lines LSG1 (-0, -1, . . . ) that transmit analog signals (sensor signals) output from the sensors 111 (-0, -1, . . . ).

In the first chip 110A, sample hold (SH) circuits 112 (-0, -1, . . . ) that sample the sensor signals of the sensors 111(-0, -1, . . . ) at a first clock CLK11 are arranged on the first signal lines LSG1 (-0, -1, . . . ).

On the first signal lines LSG1 (-0, -1, . . . ), amplifiers 113 (-0, -1, . . . ) that amplify the sensor signals output from the sample hold (SH) circuits 112 (-0, -1, . . . ) are arranged.

Further, the first chip 110A has TCVs 114 (-0, -1, . . . ) that electrically connect the first signal lines LSG1 (-0, -1, . . . ) to the second chip 120A side and transmit the sensor signals.

Note that although not shown in the figure, the first chip 110A has TCVs for supplying power and transmitting control signals.

The second chip 120A has second signal lines LSG2 (-0, -1, . . . ) connected to the respective TCVs 114 formed in the first chip 110A.

On the second signal lines LSG2 (-0, -1, . . . ), sampling switches 121 (-0, -1, . . . ) that sample the sensor signals transmitted through the TCVs 114 at a second clock CLK12 are arranged.

On the second signal lines LSG2 (-0, -1, . . . ), quantizers 122(-0, -1, . . . ) that quantize the signals sampled by the sampling switches 121 (-0, -1, . . . ) are arranged.

The second chip 120A has a signal processing circuit 123 that performs the digital calculation processing of the signals quantized by the quantizers 122-1, -2, . . . ).

In the semiconductor apparatus 100A, the signals output from the sensors 111 are sample-held by the SH circuits 112 and then transmitted to the TCVs 114 through the amplifiers 113.

Here, if the power of the signals output from the sensors 111 from the SH circuits 112 is substantially large, the amplifiers may not be arranged.

The signals transmitted through the TCVs 114 are sampled by the sampling switches 121 of the second chip 120A serving as a logic chip (digital chip) and then quantized by the quantizers 122 in a voltage direction. The data thus digitized is calculated by the signal processing circuit 123.

Figure 1:
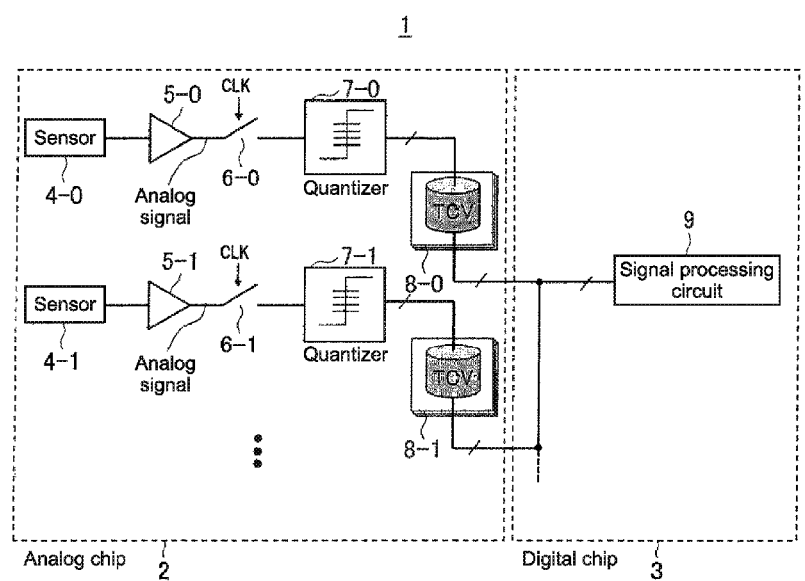
FIG. 1 A diagram showing a first configuration example where signals transmitted through TCVs are time-discretized and quantized signals in a semiconductor apparatus using laminated chips.
Figure 2:
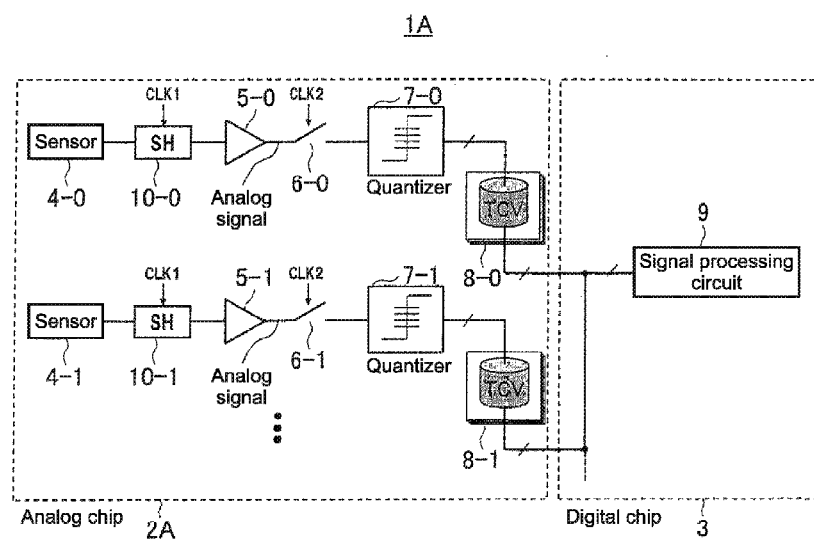
FIG. 2 A diagram showing a second configuration example where the signals transmitted through the TCVs are time-discretized and quantized signals in a semiconductor apparatus using laminated chips.
Figure 3:
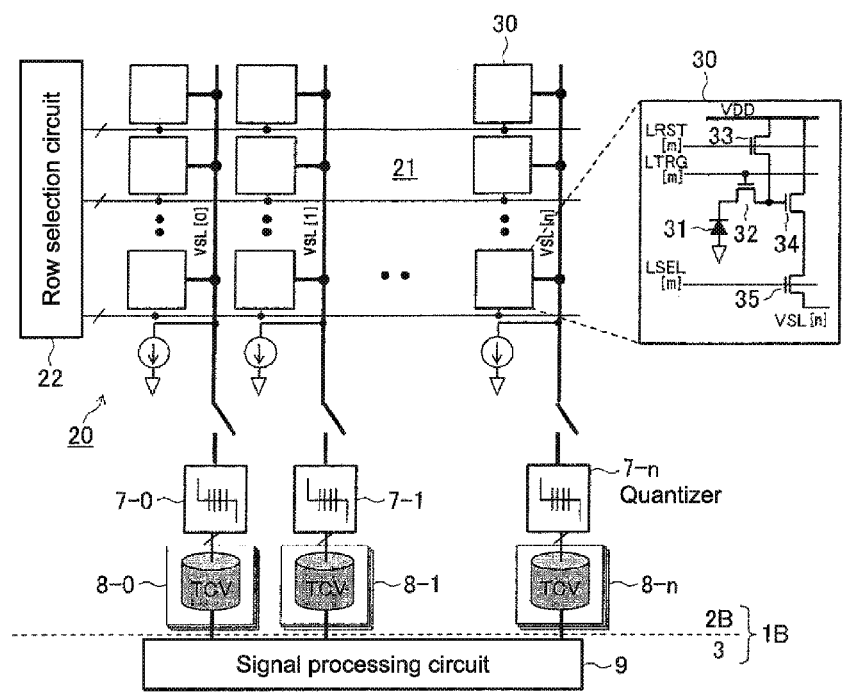
FIG. 3 A diagram showing a third configuration example where the signals transmitted through the TCVs are time-discretized and quantized signals in a semiconductor apparatus using laminated chips and is a diagram showing an example where the configuration example shown in FIG. 2 is applied to a CMOS image sensor.
Figure 4:
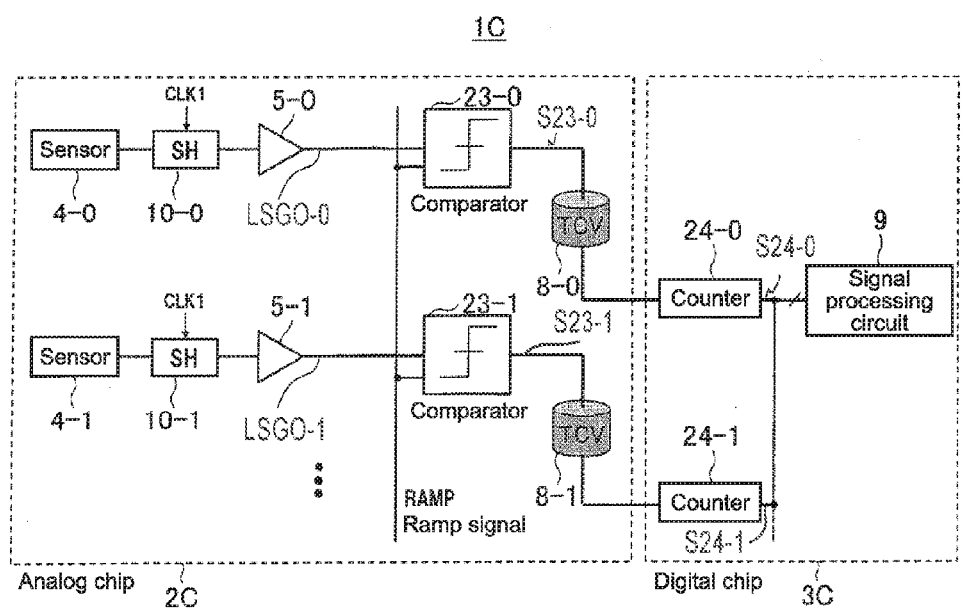
FIG. 4 A diagram showing a first configuration example where the signals transmitted through the TCVs are continuous-time and quantized signals in a semiconductor apparatus using laminated chips.
Figure 5:
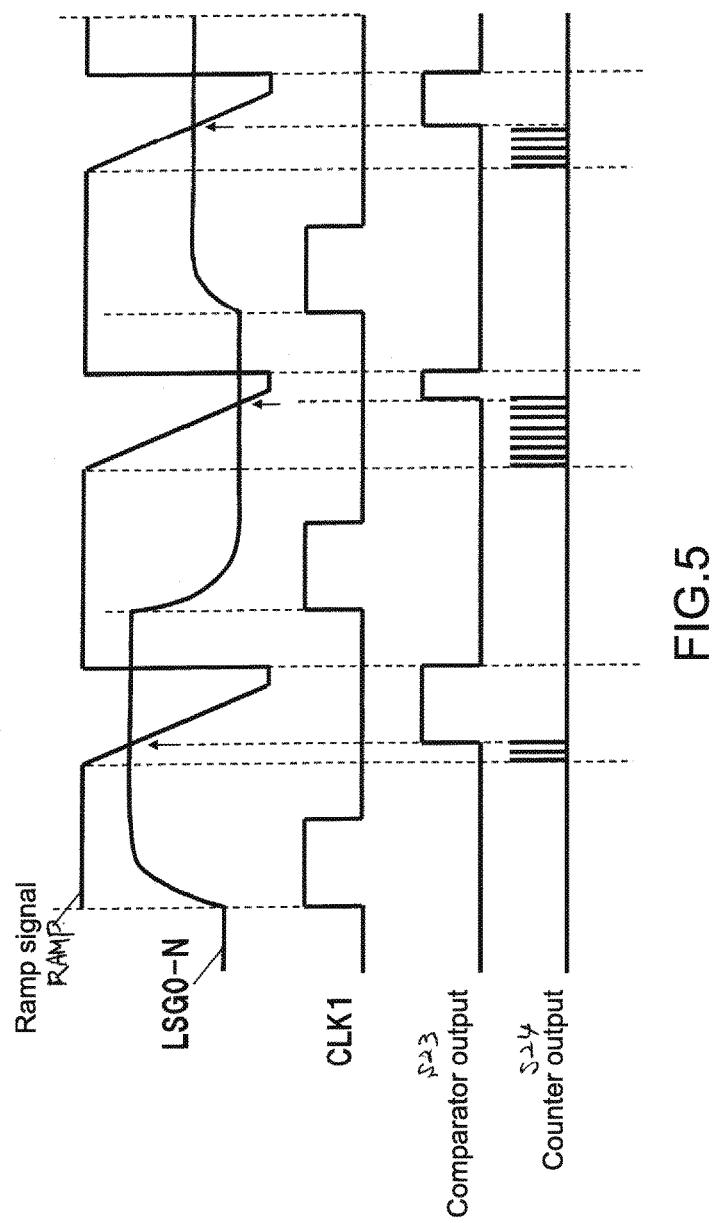
FIG. 5 A diagram where the operations of the semiconductor apparatus shown in FIG. 4 are shown using waveforms in a time axis.
Figure 6:
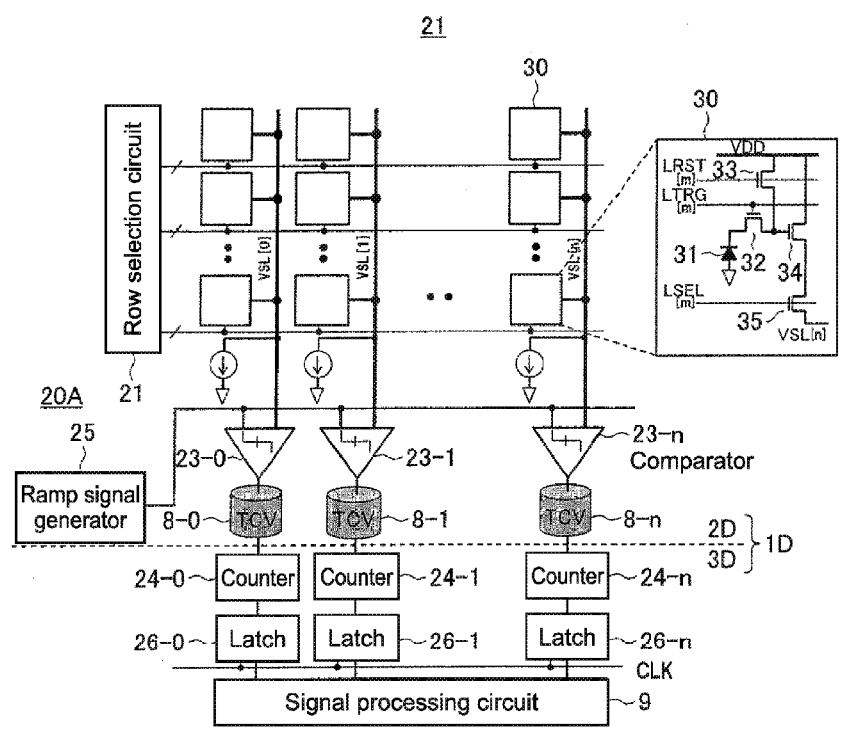
FIG. 6 A diagram showing a second configuration example where the signals transmitted through the TCVs are time-discretized and quantized signals in a semiconductor apparatus using laminated chips and is a diagram applied to a CMOS image sensor.

According to the technology shown in FIG. 2, the signals transmitted through the TCVs are quantized in a voltage direction.

On the contrary, according to the present technology, the signals transmitted through the TCVs are discretized in a time direction. In other words, the signals transmitted through the TCVs are continuous signals, i.e., discrete-time analog signals in a voltage direction.

Also in this case, interference from the adjacent TCVs 114 occurs in the signals.

However, the interference from the adjacent TCVs with respect to the signals can be prevented by appropriately controlling the timing of the first clock CLK11 at which the signals are sample-held by the SH circuits 112 and the timing of the second clock CLK12 at which the discrete-time analog signals are sampled in the second chip 120A.

FIGS. 11(A) to (C) are diagrams showing the time relationship between the signals of the semiconductor apparatus according to the embodiment.

FIG. 11(A) shows the signal waveform of a node ND11 to which the signal transmitted through the TCV is supplied, FIG. 11(B) shows the first clock CLK11, and FIG. 11(C) shows the second clock CLK12.

Attention is now paid to the node ND11 of the discrete-time analog signal transmitted through the TCV 114.

Because the first clock CLK11 uses the timing common to the SH circuits 112 connected to all the sensors 111, the signal transition time of the node ND11 and that of the adjacent node ND12 are ideally synchronized with each other.

However, if an error occurs in the timing for outputting the signal from the sensor between the node ND11 and the node N12 due to, for example, the delay of the signal through the wiring, a whisker resulting from the interference is caused in the signal of the node N11 as shown in FIG. 11(A).

However, the signal has been time-discretized by the SH circuit 112 in an interval where one data is transmitted. Therefore, the signal has a fixed value in the interval and is stabilized at a desired value after the lapse of sufficient time.

The semiconductor apparatus is so driven as to perform the sampling using the second clock CLK12 at the timing at which the signal is stabilized at the substantial value, thereby making it possible to reduce the error caused by the interference from the TCVs 114 to a negligible level.

<1.2 Second Arrangement Configuration Example in Semiconductor Apparatus>

Figure 12:
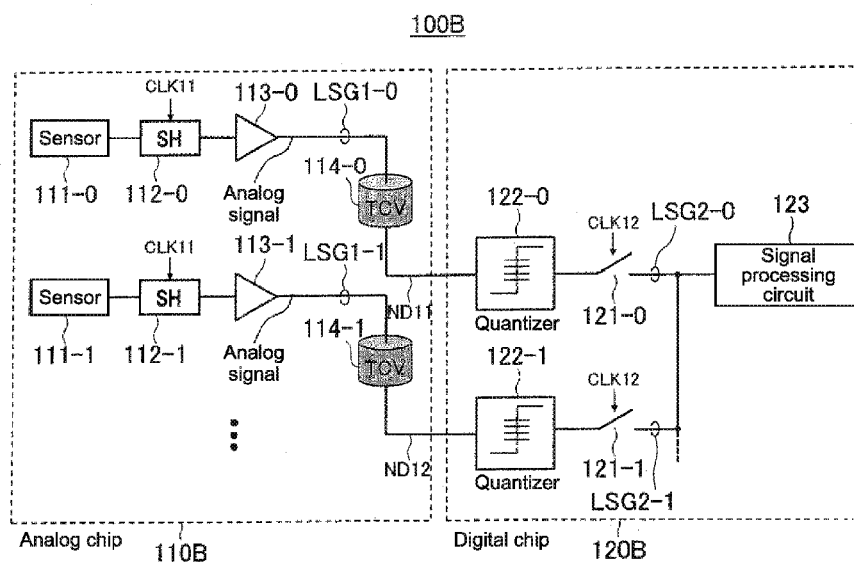
FIG. 12 A diagram showing a second arrangement configuration example of the circuits or the like in the semiconductor apparatus according to the embodiment.

FIG. 12 is a diagram showing a second arrangement configuration example of the circuits or the like in a semiconductor apparatus according to the embodiment.

The semiconductor apparatus 100B shown in FIG. 12 is different from the semiconductor apparatus 100A shown in FIG. 10 in the following point.

That is, in a second chip 120B, the sampling switches 121 (-0, -1, . . . ) and the quantizers 122 (-0, -1, . . . ) are arranged on the second signal lines LSG2 (-0, -1, . . . ) in a reverse order (reversely connected).

According to the present technology, the sampling and the quantization at the timing of the second clock CLK12 may be performed in the order of the quantization in continuous time and the sampling switches 121 connected to the quantizers 122.

In this case, the operations of the sampling switches 121 are realized by the provision of flip-flop circuits with respect to the signals.

The configuration shown in FIG. 10 may generate kT/C noise when the sampling switches 121 are turned off, which may cause a problem. However, the configuration shown in FIG. 12 is free from kT/C noise.

<1.3 Third Arrangement Configuration Example in Semiconductor Apparatus>

Figure 13:
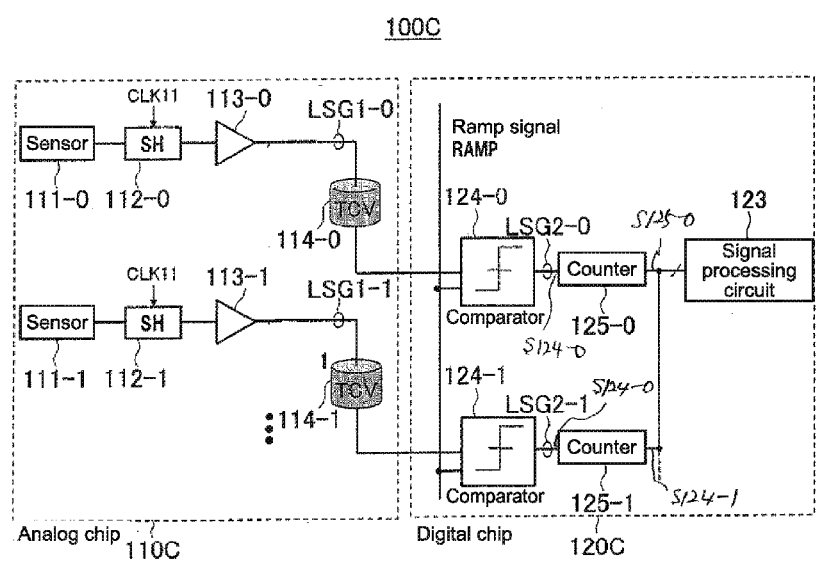
FIG. 13 A diagram showing a third arrangement configuration example of the circuits or the like in the semiconductor apparatus according to the embodiment.

FIG. 13 is a diagram showing a third arrangement configuration example of the circuits or the like in the semiconductor apparatus according to the embodiment.

A semiconductor apparatus 100C shown in FIG. 13 is different from the semiconductor apparatuses 100A and 100B shown in FIGS. 10 and 12 in the following point.

That is, a second chip 120C has comparators 124 (-0, -1, . . . ) and counters 125 (-0, -1, . . . ) instead of the sampling switches and the quantizers.

In the second chip 120C, the comparators 124 compare a ramp signal RAMP with the sensor signals transmitted through the TCVs 114 so as to be converted from a voltage axis to a time axis, and then the counters 125 quantizes time information.

Figure 11:
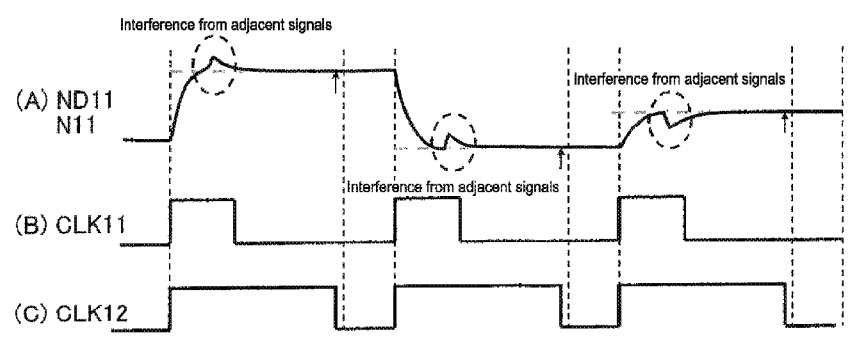
FIG. 11 Diagrams showing the time relationship between the signals of the semiconductor apparatus according to the embodiment.
Figure 14:
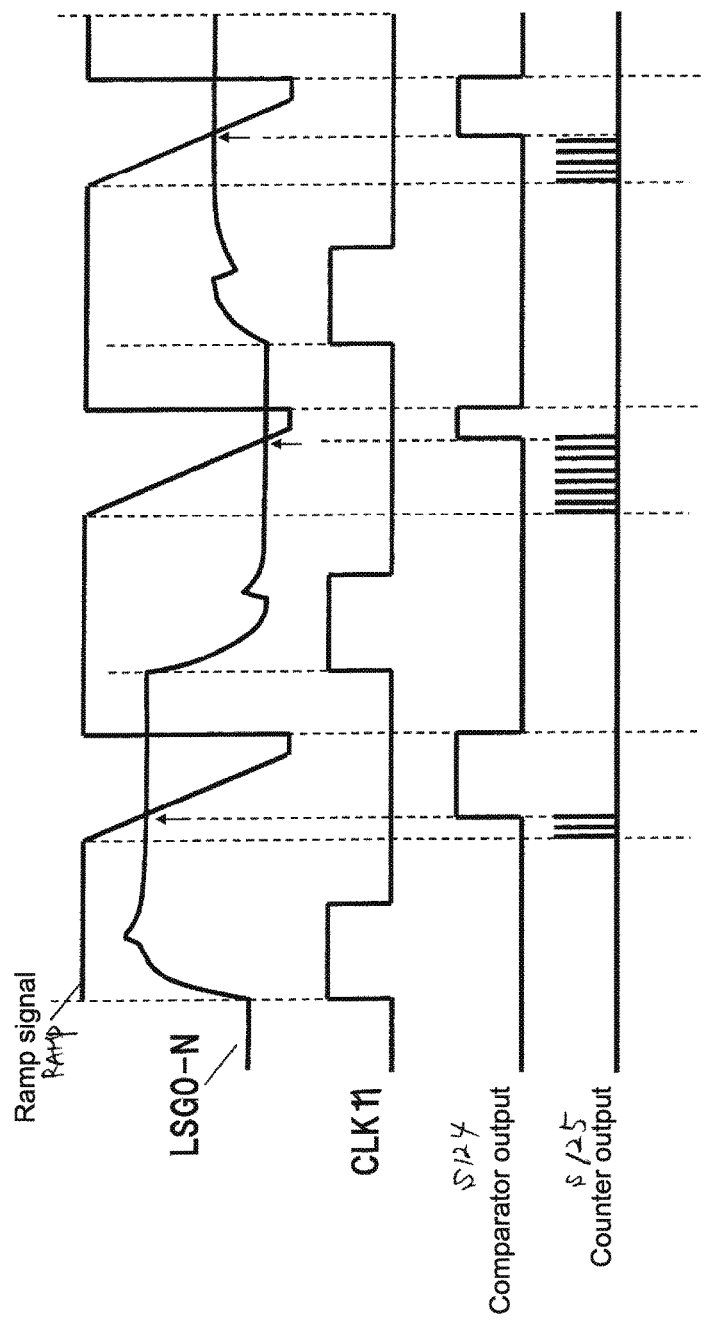
FIG. 14 A diagram showing using time-axis waveforms that interference from the adjacent columns can be reduced by the operations of the semiconductor apparatus shown in FIG. 13.

FIG. 14 shows that the interference from the adjacent columns can be reduced based on the same principle as that of FIG. 11. In the configuration shown in FIG. 13, an AD conversion operation is performed in such a manner that ramp waves RAMP are compared with the signals and the time is converted into a digital value by the counters 124. Accordingly, the AD converter does not fetch the signals while the ramp waves and counters 124 do not operate.

Here, as shown in FIG. 14, the transition of the ramp waves and the operations of the counters are started after the output of the signal LSGO-N is substantially stabilized, thereby making it possible to reduce the error caused by the interference from the adjacent TCVs as in the case of FIG. 11.

<2. Outline of Solid-State Image Sensing Apparatus>

A description will be given of a configuration example of a CMOS image sensor serving as a solid-state image sensing apparatus as an example of the semiconductor apparatus according to the embodiment.

<2.1 Basic Configuration of Solid-State Image Sensing Apparatus>

Figure 15:
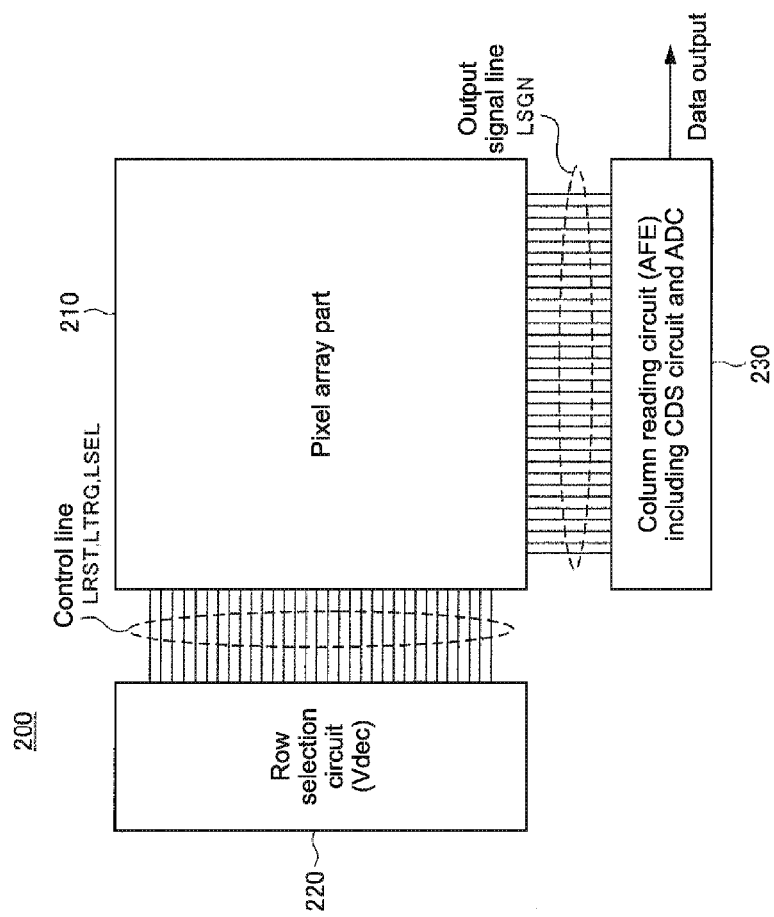
FIG. 15 A diagram showing a basic configuration example of a CMOS image sensor (solid-state image sensing apparatus) according to the embodiment.

FIG. 15 is a diagram showing a basic configuration example of a CMOS image sensor (solid-state image sensing apparatus) according to the embodiment.

A CMOS image sensor 200 shown in FIG. 15 has a pixel array part 210, a row selection circuit (Vdec) 220, and a column reading circuit (AFE) 230.

The row selection circuit 220 and the column reading circuit 230 form a pixel signal reading part.

The CMOS image sensor 200 serving as a semiconductor apparatus employs the laminated structure shown in FIG. 9.

According to the embodiment, the laminated structure is basically configured such that the first chip 110 has the pixel array part 210 and the second chip 120 has the row selection circuit 220 and the column reading circuit 230 forming the pixel signal reading part.

Then, signals for driving pixels, analog read signals of the pixels (sensors), a power supply voltage, and the like are transferred between the first chip 110 and the second chip 120 through the TCVs formed in the first chip 110.

The pixel array part 210 has a plurality of pixel circuits 210A two-dimensionally arranged in M (rows)×N (columns) (matrix) form.

Figure 16:
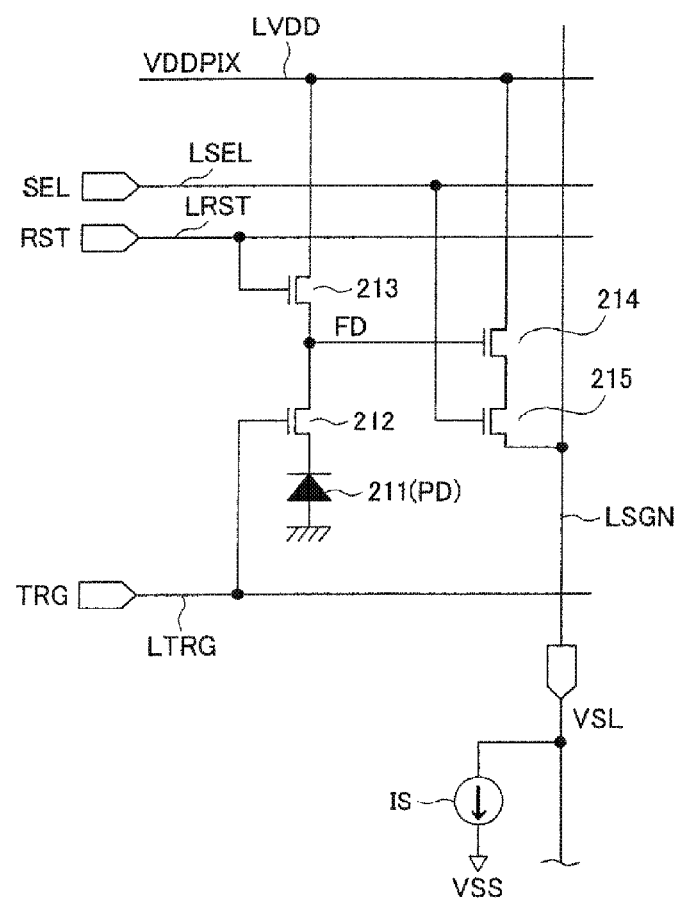
FIG. 16 A diagram showing an example of a pixel of a CMOS image sensor composed of four transistors according to the embodiment.

FIG. 16 is a diagram showing an example of a pixel of a CMOS image sensor composed of four transistors according to the embodiment.

The pixel circuit 210A has a photoelectric conversion element (hereinafter simply referred to as a PD when necessary) 211 composed of, for example, a photodiode (PD).

Then, with respect to the one photoelectric conversion element 211, the pixel circuit 210A has four transistors serving as active elements, i.e., a transfer transistor 212, a reset transistor 213, an amplification transistor 214, and a selection transistor 215.

The photoelectric conversion element 211 photoelectrically converts incident light into charges (here, electrons) of an amount corresponding to the amount of the light.

The transfer transistor 212 serving as a transfer element is connected between the photoelectric conversion element 211 and a floating diffusion FD serving as an input node. A transfer signal TRG serving as a control signal is supplied to the gate (transfer gate) of the transfer transistor 212 through a transfer control line LTRG.

Thus, the transfer transistor 212 transfers the electrons photoelectrically converted by the photoelectric conversion element 211 to the floating diffusion FD.

The reset transistor 213 is connected between a power supply line LVDD to which a power supply VDD is supplied and the floating diffusion FD. A reset signal RST serving as a control signal is supplied to the gate of the reset transistor 213 through a reset control line LRST.

Thus, the reset transistor 213 serving as a reset element resets the potential of the floating diffusion FD to that of the power supply line LVDD.

The floating diffusion FD is connected to the gate of the amplification transistor 214 serving as an amplification element. That is, the floating diffusion FD functions as the input node of the amplification transistor 214 serving as an amplification element.

The amplification transistor 214 and the selection transistor 215 are connected in series between the power supply line LVDD to which the power supply voltage VDD is supplied and a signal line LSGN.

Thus, the amplification transistor 214 is connected to the signal line LSGN through the selection transistor 215 and constitutes a source follower circuit with a constant current source IS outside the pixels.

Then, a selection signal SEL serving as a control signal corresponding to an address signal is supplied to the gate of the selection transistor 215 through the selection control line LSEL, and the selection transistor 215 is turned on.

When the selection transistor 215 is turned on, the amplification transistor 214 amplifies the potential of the floating diffusion FD and outputs a voltage corresponding to the potential to the signal line LSGN. The voltage output from each of the pixels through the signal line LSGN is output to the column reading circuit 230.

Because the respective gates of the transfer transistor 212, the reset transistor 213, and the selection transistor 215 are, for example, connected in units of rows, these operations are simultaneously performed for each of the pixels by one row.

In the pixel array part 210, the wiring of the reset control line LRST, the transfer control line LTRG, and the selection control line LSEL is installed as a group in units of the rows of pixel arrangement.

Each of the control lines LRST, LTRG, and LSEL has M-lines.

The reset control lines LRST, the transfer control lines LTRG, and the selection control lines LSEL are driven by the row selection circuit 220.

As described above, the pixel array part 210 having such a configuration includes the signal wiring and the control wiring and is formed in the first chip 110.

Further, according to the embodiment, the constant current sources IS constituting the source follower circuits with the amplification transistors 214 arranged in the first chip 110 are arranged in the second chip 120.

The row selection circuit 220 controls the operations of the pixels arranged in any rows of the pixel array part 210. The row selection circuit 220 controls the pixels through the control lines LSEL, LRST, and LTRG.

Depending on, for example, a shutter mode switch signal, the row selection circuit 220 switches an exposure system to either a rolling shutter system where an exposure is performed for each row or a global shutter system where an exposure is simultaneously performed for all pixels, thereby performing image driving control.

The column reading circuit 230 receives the data of the rows of the pixels read and controlled by the row selection circuit 220 through the signal output lines LSGN and then transfers the received data to a subsequent-stage signal processing circuit.

The column reading circuit 230 includes a CDS circuit and an ADC (Analog Digital Converter).

<2.2 Configuration Example of Solid-State Image Sensing Apparatus Having Column-Parallel ADCs>

Note that a CMOS image sensor according to the embodiment is not particularly limited but may be configured as a CMOS image sensor having, for example, column-parallel analog-digital converting apparatuses (hereinafter abbreviated as ADCs).

Figure 17:
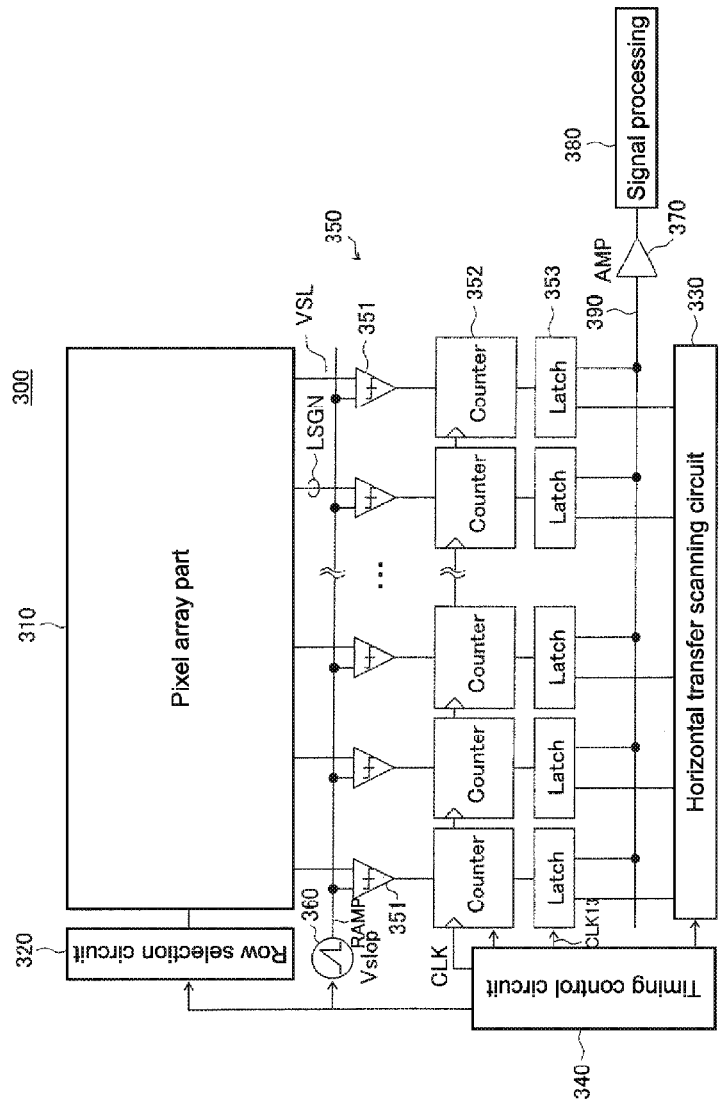
FIG. 17 A block diagram showing a configuration example of a CMOS image sensor (solid-state image sensing apparatus) having column-parallel ADCs according to the embodiment.

FIG. 17 is a block diagram showing a configuration example of a CMOS image sensor (solid-state image sensing apparatus) having column-parallel ADCs according to the embodiment.

As shown in FIG. 17, a solid-state image sensing element 300 has a pixel array part 310 serving as an image sensing part, a row selection circuit 320 serving as a pixel driving part, a horizontal transfer scanning circuit 330, and a timing control circuit 340.

Moreover, the solid-state image sensing element 300 has an ADC group 350, a digital-analog converting apparatus (hereinafter abbreviated as a DAC (Digital Analog Converter)) 360 serving as a ramp signal generator, amplification circuits (S/A) 370, a signal processing circuit 380, and a horizontal transfer line 390.

The pixel array part 310 has the plurality of pixels shown in, for example, FIG. 16 arranged in matrix form, each of the pixels having a photoelectric conversion element (photodiode) and an in-pixel amplifier.

Further, the solid-state image sensing element 300 has the following circuits serving as control circuits that successively read signals transferred from the pixel array part 310.

That is, the solid-state image sensing element 300 has, as the control circuits, the timing control circuit 340 that generates an internal clock, the row selection circuit 320 that controls row addresses and row scanning, and the horizontal transfer scanning circuit 330 that controls column addresses and column scanning.

In the ADC group 350, a plurality of columns of single slope ADCs each having a comparator 351, a counter 352, and a latch 353 are arranged.

The comparator 351 compares a reference voltage Vslop having a ramp waveform (RAMP) obtained by varying a reference voltage generated by the DAC 360 in a staircase pattern with an analog signal obtained from a pixel through the vertical signal line LSGN for each row line.

The counter 352 counts the comparison time of the comparator 351.

The ADC group 350 has an n-bit digital signal conversion function and is arranged for each vertical signal line (column line) to constitute a column-parallel ADC block.

The output of the latch 353 is connected to the horizontal transfer line 390 having, for example, a 2n bit width.

Further, the 2n amplification circuits 370 and the signal processing circuit 380 corresponding to the horizontal transfer line 390 are arranged.

In the ADC group 350, the comparator 351 arranged for each column compares the analog signal (potential VSL) read to the vertical signal line LSGN with the reference voltage Vslop (slope waveform that has a certain inclination and linearly varies).

At this time, the counter 352 arranged for each column operates as is the case with the comparator 351. The potential (analog signal) VSL of the vertical signal line is converted into a digital signal in such a manner that the certain potential Vslop of the ramp waveform RAMP varies corresponding to the counter value.

In order to vary the reference voltage Vslop, variation in voltage is converted into variation in time, and the time is counted at a certain cycle (clock) to convert the potential into the digital value.

Then, when the analog electric signal VSL crosses the reference voltage Vslop, the output of the comparator 351 is inverted to stop the input clock of the counter 352, thereby completing the AD conversion.

After the completion of the AD conversion described above, the horizontal transfer scanning circuit 330 inputs data held by the latch 353 to the signal processing circuit 380 through the horizontal transfer line 390 and the amplification circuits 370, thereby generating a two-dimensional image.

The column-parallel output processing is thus performed.

Note that a specific configuration of the comparator 351 employed here will be described in detail below.

The CMOS image sensor 300 serving as a semiconductor apparatus also employs the laminated structure shown in FIG. 9.

In the laminated structure according to the embodiment, the first chip 110 basically has the pixel array part 310.

The second chip 120 has the row selection circuit 320, the horizontal transfer scanning circuit 330, the timing control circuit 340, the ADC group 350, the DAC (ramp signal generator) 360, the amplification circuits (S/A) 370, the signal processing circuit 380, and the horizontal transfer line 390.

Then, signals for driving the pixels, analog read signals of the pixels (sensors), a power supply voltage, and the like are transferred between the first chip 110 and the second chip 120 through the TCVs formed in the first chip 110.

<2.3 First Arrangement Configuration Example in Solid-State Image Sensing Apparatus>

Here, a description will be given of a configuration example where the constituents of the CMOS image sensor having the column-parallel ADCs shown in FIG. 17 are arranged in a first chip and a second chip of a laminated structure.

Figure 18:
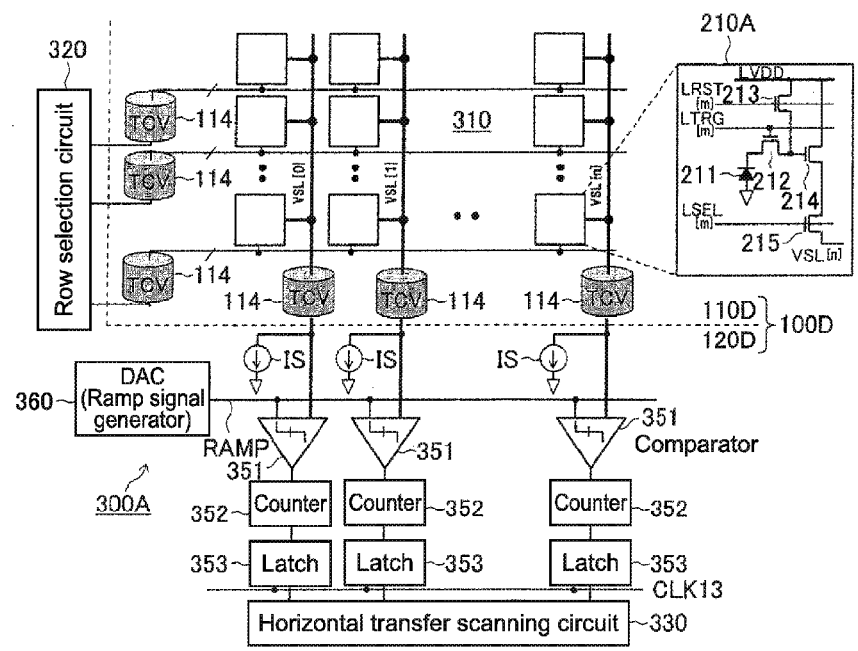
FIG. 18 A diagram showing a first arrangement configuration example of the circuits or the like in the CMOS image sensor having column-parallel ADCs according to the embodiment.

FIG. 18 is a diagram showing a first arrangement configuration example of the circuits or the like in a CMOS image sensor having column-parallel ADCs according to the embodiment.

Also in FIG. 18, a first chip 110D and a second chip 120D are two-dimensionally developed to facilitate the understanding of the arrangement of the circuits or the like such as the first chip 110D and the second chip 120D of the laminated structure.

Further, in FIG. 18, the timing control circuit 340, the amplification circuits 370, and the signal processing circuit 380 are omitted. The second chip 110D also has these circuits.

As described above, in the laminated structure, the first chip 110D basically has the pixel array part 310.

The second chip 120D has the row selection circuit 320, the horizontal transfer scanning circuit 330, the timing control circuit 340, the comparators 351 of the ADC group 350, the counters 352, the latches 353, and the DAC (ramp signal generator) 360.

Then, signals for driving the pixels, analog read signals of the pixels (sensors), a power supply voltage, and the like are transferred between the first chip 110D and the second chip 120D through the TCVs 114 formed in the first chip 110D.

Note that according to the embodiment, the current sources IS constituting the source follower circuits with the amplification transistors or the like of the pixels arranged in the first chip 110D are arranged in the second chip 120D.

The exemplified arrangement of the constituents shown in FIG. 18 is performed in the same manner as that shown in FIG. 13.

In the CMOS image sensor 300A shown in FIG. 18, the transfer control signal TRG, which is output from the column selection circuit 320 and used for controlling the on/off of the transfer transistors (transfer switches), has the same function as that of the first clock CLK11 shown in FIG. 13.

On the other hand, the timing for generating the ramp waves is controlled to substantially stabilize the VSL(m), thereby making it possible to transmit the signals while reducing the error caused by the interference from the adjacent TCVs as shown in FIG. 14.

Figure 19:
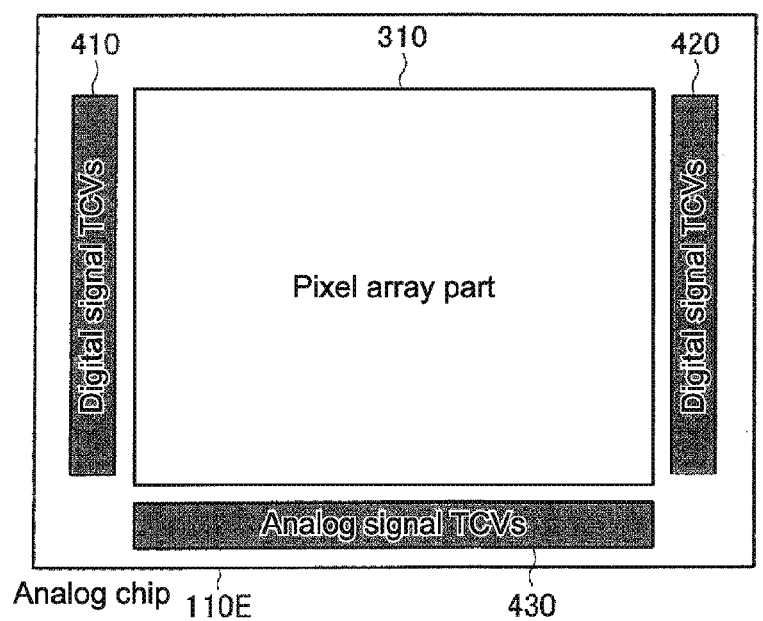
FIG. 19 A diagram showing an example where the TCVs for transmitting discrete-time analog signals are concentrated and separated from the TCVs for transmitting digital signals.

FIG. 19 is a diagram showing an example where the TCVs for transmitting the discrete-time analog signals are concentrated and separated from the TCVs for transmitting the digital signals.

This configuration can reduce the interference from the adjacent TCVs.

However, in the system shown in FIG. 18, for example, the row selection circuit 320 outputs normal digital signals for turning on/off the switches, and it is not easy to reduce the interference with the signal lines LSGN(n) based on these signals.

Therefore, according to the present technology, as shown in FIG. 19, it is effective to concentrate the TCVs for transmitting the discrete-time analog signals and separate such TCVs from the TCVs for transmitting the digital signals.

In an example shown in FIG. 19, a first chip 110E has regions 410 and 420 where the TCVs for transmitting the digital signals are arranged on both right and left sides of the pixel array part 310 in FIG. 19.

Further, a region 430 where the TCVs for transmitting the analog signals are arranged is formed on the lower side of the pixel array part 310 in FIG. 19.

<2.4 Second Arrangement Configuration Example in Solid-State Image Sensing Apparatus>

Figure 20:
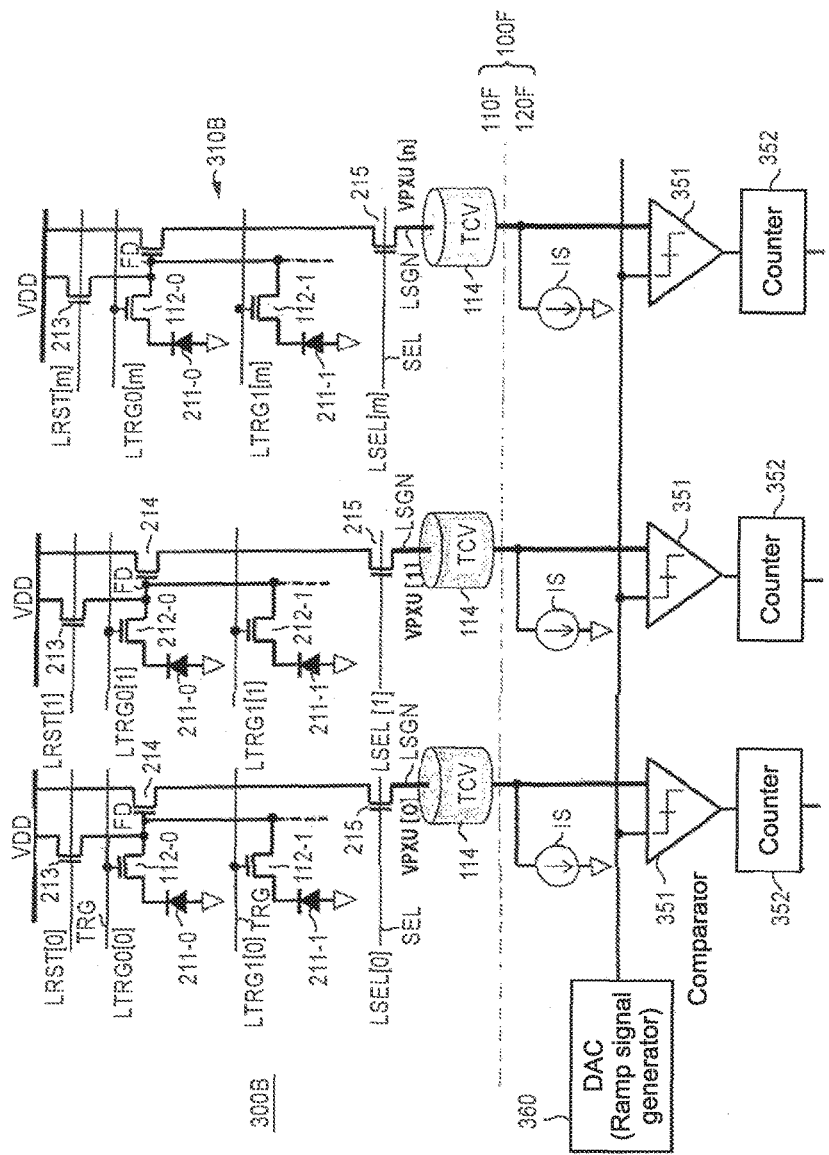
FIG. 20 A diagram showing a second arrangement configuration example of the circuits or the like in the CMOS image sensor having column-parallel ADCs according to the embodiment.

FIG. 20 is a diagram showing a second arrangement configuration example of the circuits or the like in a CMOS image sensor having column-parallel ADCs according to the embodiment.

The CMOS image sensor 300B shown in FIG. 20 shows a case where one floating diffusion FD is shared by a plurality of pixels in a pixel array part 310B.

In the example shown in FIG. 20, the floating diffusion FD, the reset transistor 213, the amplification transistor 214, and the selection transistor 215 are shared by two pixels.

Each of the pixels is configured to include the photoelectric conversion element (photodiode) 211 and the transfer transistor 212.

Also in this case, a first chip 110F basically has the pixel array part 310B, and other configurations are the same as those shown in FIG. 18.

<2.5 Third Arrangement Configuration Example in Solid-State Image Sensing Apparatus>

Figure 21:
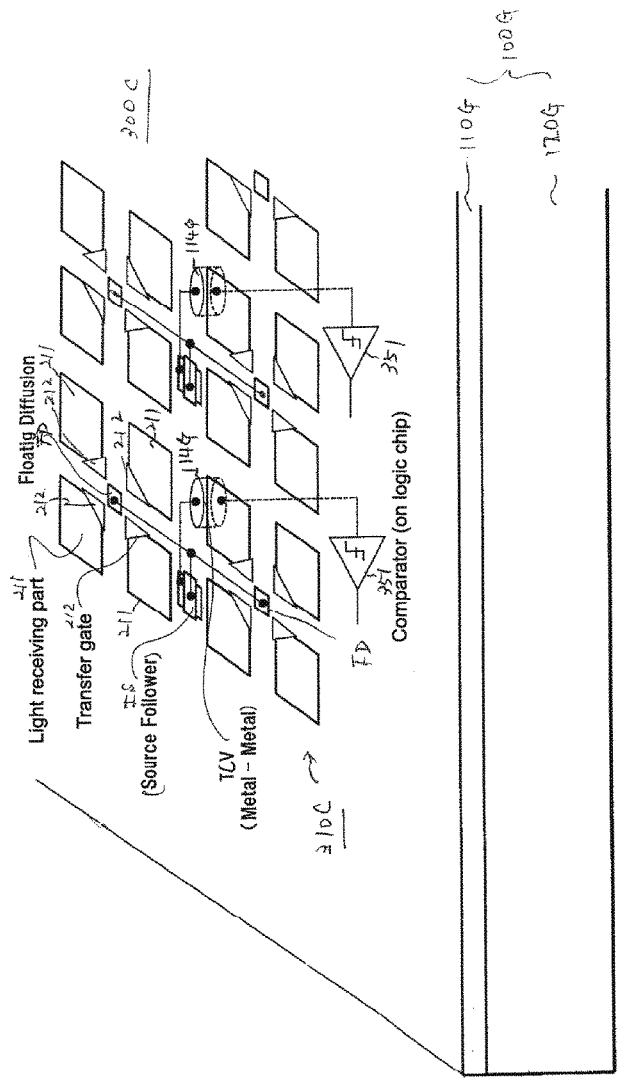
FIG. 21 A diagram showing a third arrangement configuration example of the circuits or the like in the CMOS image sensor having column-parallel ADCs according to the embodiment.

FIG. 21 is a diagram showing a third arrangement configuration example of the circuits or the like in a CMOS image sensor having column-parallel ADCs according to the embodiment.

As in the case of FIG. 20, a CMOS image sensor 300C shown in FIG. 21 shows a case where one floating diffusion FD is shared by a plurality of pixels in a pixel array part 310C.

Also in this case, a first chip 110G basically has the pixel array part 310C.

In this example, TCVs 114G are formed near shared regions.

The TCVs 114G are formed in such a manner that the connection electrodes made of metal (for example, Cu) formed in the first chip 110G and a second chip 120G are connected to each other by metal. The pixel signals output to the signal lines LSGN are supplied to the comparators 351 of the second chip 120G through the TCVs 114G.

<3. Configuration Example of Comparator>

Next, a description will be given of a specific configuration example of the comparator 351 that is applied to the ADC group and forms the column ADC.

In performing the present technology described above, there is a concern that the noise of the quantizers and the comparators arranged in the second chip serving as a digital chip becomes larger than that of the quantizers and the comparators arranged in the analog chip.

Hereinafter, a description will be given of the configuration examples of the comparators effective for the noise in the CMOS image sensors shown in FIGS. 17 to 21.

<3.1 Basic Configuration Example of Comparator>

Figure 22:
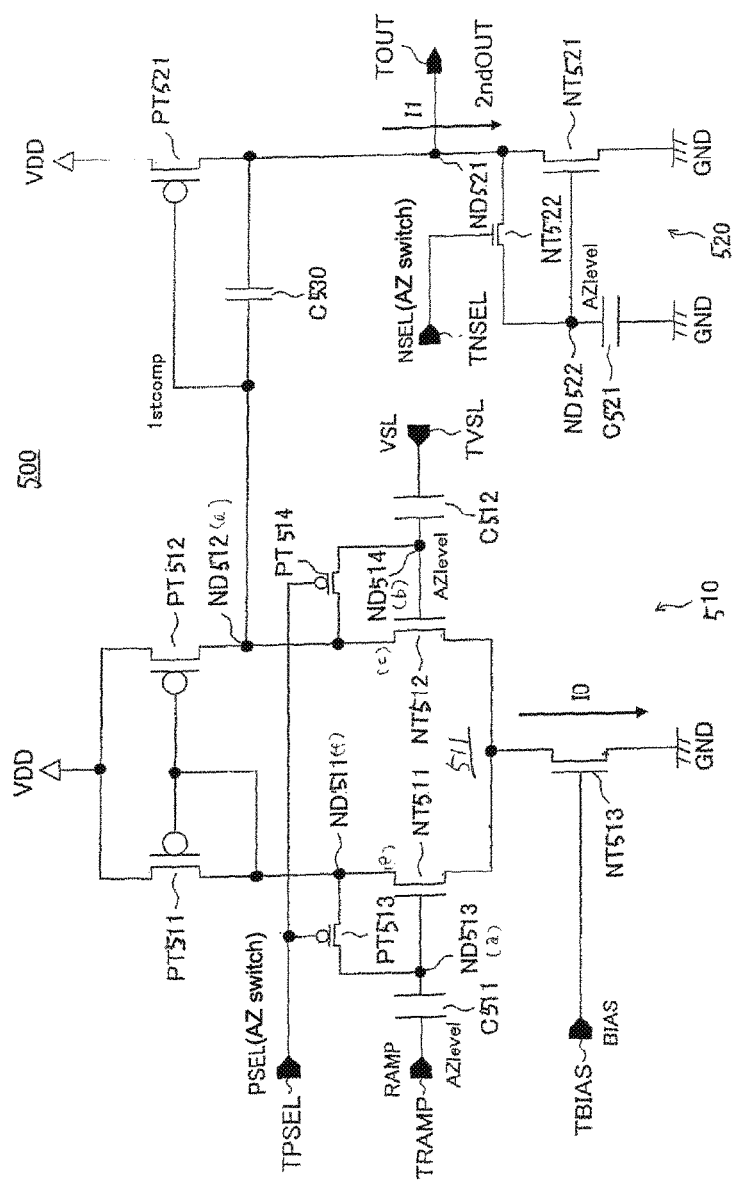
FIG. 22 A circuit diagram showing a first configuration example of a comparator according to the embodiment.

FIG. 22 is a circuit diagram showing a first configuration example of the comparator according to the embodiment.

Hereinafter, the comparator will be denoted by symbol 500.

FIG. 22 shows a configuration example of the comparator that greatly restricts a band using a mirror capacitance to reduce noise. With such a configuration, the comparator is caused to output a small noise power. Therefore, it is possible to compensate for a disadvantage caused when the comparator is arranged in the second chip serving as a digital chip.

As shown in FIG. 22, the comparator 500 arranged for each column has a first amplifier 510, a second amplifier 520, and a capacitor C530 serving as a capacitance for presenting a mirror effect, the first amplifier 510 and the second amplifier 520 being cascade-connected to each other.

Further, a capacitance is connected between the input and the output of the source grounded amplifier of the second amplifier 520 on the second stage. The capacitance presents a mirror effect and is thus equivalent to a gain-multiplied capacitance connected to a source grounded input.

Thus, the band of the comparator 500 is largely narrowed with the small capacitance.

In order to determine an operating point for every column at starting a row operation, the comparator 500 has an initializing (auto zero: AZ) and sampling function.

Note that according to the embodiment, a first conductive type is either a p-channel or an n-channel, and a second conductive type is either the n-channel or the p-channel.

The first amplifier 510 has p-channel MOS(PMOS) transistors PT511 to PT514 and n-channel MOS(NMOS) transistors NT511 to NT513 as insulation gate type field effect transistors.

The first amplifier 510 has first and second capacitors C511 and C512 as sampling capacitances (input capacitances) of an AZ level.

The source of the PMOS transistor PT511 and the source of the PMOS transistor PT512 are connected to the power supply potential source VDD.

The drain of the PMOS transistor PT511 is connected to the drain of the NMOS transistor NT511, and a node ND511 is formed at the connection point between them. Further, the drain and the gate of the PMOS transistor PT511 are connected to each other, and the connection point between them is connected to the gate of the PMOS transistor 512.

The drain of the PMOS transistor PT512 is connected to the drain of the NMOS transistor NT512, and an output node ND512 of the first amplifier 510 is formed at the connection point between them.

The source of the NMOS transistor NT511 and the source of the NMOS transistor NT512 are connected to each other, and the connection point between them is connected to the drain of the NMOS transistor NT513. The source of the NMOS transistor NT513 is connected to a reference potential source (for example, ground potential) GND.

The gate of the NMOS transistor NT511 is connected to a first electrode of the capacitor C511, and a node ND513 is formed at the connection point between them. Further, a second electrode of the capacitor C511 is connected to an input terminal TRAMP of the ramp signal RAMP.

The gate of the NMOS transistor NT512 is connected to a first electrode of the capacitor C512, and a node ND514 is formed at the connection point between them. Further, a second electrode of the capacitor C512 is connected to an input terminal TVSL of the analog signal VSL.

Furthermore, the gate of the NMOS transistor NT513 is connected to an input terminal TBIAS of a bias signal BIAS.

The source of the PMOS transistor PT513 is connected to the node ND511, and the drain thereof is connected to the node ND513. The source of the PMOS transistor PT514 is connected to the node ND512, and the drain thereof is connected to the node ND514.

Further, the gates of the PMOS transistors PT513 and PT514 are commonly connected to an input terminal TPSEL of a low-level and active first AZ signal PSEL.

In the first amplifier 510 having such a configuration, the PMOS transistors PT511 and PT512 constitute a current mirror circuit.

Further, the NMOS transistors NT511 and NT512 constitute a differential comparison part (transconductance amplifier (Gm amplifier)) 511 that uses the NMOS transistor NT513 as a power supply source.

Further, the PMOS transistors PT513 and PT514 function as AZ (auto-zero: initialization) switches, and the capacitors C511 and C512 function as sampling capacitances of an AZ level.

Then, an output signal 1stcomp of the first amplifier 510 is output from the output node ND512 to the second amplifier 520.

The second amplifier 520 has a PMOS transistor PT521, NMOS transistors NT521 and NT522, and a third capacitor C521 serving as a sampling capacitance of an AZ level.

The source of the PMOS transistor PT521 is connected to the power supply potential source VDD, and the gate thereof is connected to the output node ND512 of the first amplifier 510.

The drain of the PMOS transistor PT521 is connected to the drain of the NMOS transistor NT521, and an output node ND521 is formed at the connection point between them.

The source of the NMOS transistor NT521 is connected to the ground potential GND, and the gate thereof is connected to a first electrode of the capacitor C521. A node ND522 is formed at the connection point between them. A second electrode of the capacitor C521 is connected to the ground potential GND.

The drain of the NMOS transistor NT522 is connected to the node ND521, and the source thereof is connected to the node ND522.

Further, the gate of the NMOS transistor NT522 is connected to an input terminal TNSEL of a high-level and active second AZ signal NSEL.

The second AZ signal NSEL has a level complementary to that of the first AZ signal PSEL supplied to the first amplifier 510.

In the second amplifier 520 having such a configuration, the PMOS transistor PT521 constitutes an input and amplification circuit.

Further, the NMOS transistor PT522 functions as an AZ switch, and the capacitor C521 functions as a sampling capacitance of an AZ level.

Further, the output node ND521 of the second amplifier 520 is connected to an output terminal TOUT of the comparator 500.

A first electrode of the capacitor C530 is connected to the gate (input) of the PMOS transistor PT521 as a source grounded amplifier, and a second electrode thereof is connected to the drain (output) of the PMOS transistor PT521.

The capacitor C530 presents a mirror effect and is thus equivalent to a gain-multiplied capacitance connected to a source grounded input.

Assuming that the gain of the PMOS transistor PT521 is $A_{V2}$ and the capacitance of the capacitor C530 is C, the capacitance of the output of the first amplifier 510 is gain-multiplied like $\{C \times (1+A_{V2})\}$. Therefore, the capacitance value of the capacitor C530 may be small.

Thus, the band of the comparator 500 is largely narrowed with the small capacitance.

In the arrangement of a mirror capacitance in the output of the first amplifier 510 on the first stage of the comparator 500, there is basically employed a method of reducing a noise band, i.e., a noise operating band. Therefore, an operating speed is reduced, and a certain noise reduction effect is small.

Moreover, due to the principle that noise is reduced by the limitation of a band, this configuration is not effective for low-frequency noise such as flicker noise and RTS noise.

Hereinafter, a description will be made of a configuration capable of further reducing noise, particularly, low-frequency noise in the comparator 500.

The comparator that will be described below has characteristics in the configuration of a first amplifier.

Note that in the following description, the same constituents as those of FIG. 22 will be basically denoted by the same symbols to facilitate the understanding of the constituents.

<3.2 Basic Configuration Example of Comparator Capable of Reducing Low-Frequency Noise>
[Basic Concept of Configuration]

Figure 23:
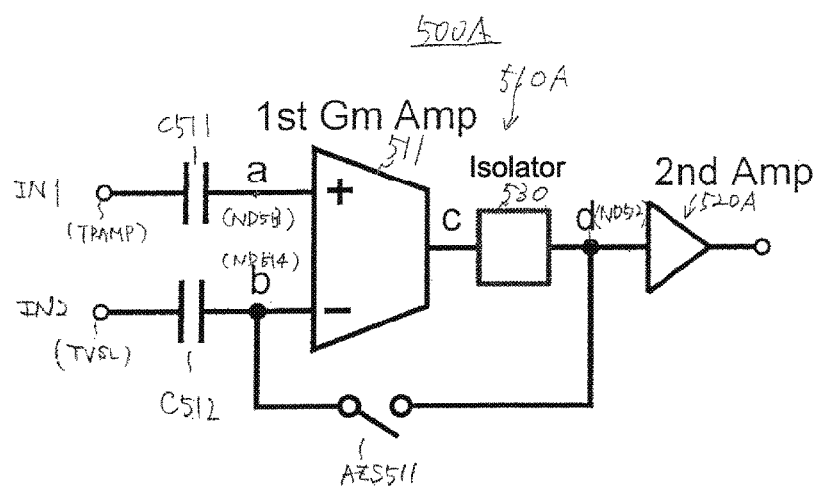
FIG. 23 A diagram showing the basic concept of a comparator having an isolator and capable of reducing low-frequency noise according to the embodiment.

FIG. 23 is a diagram showing the basic concept of a comparator having an isolator and capable of reducing low-frequency noise according to the embodiment.

Figure 24:
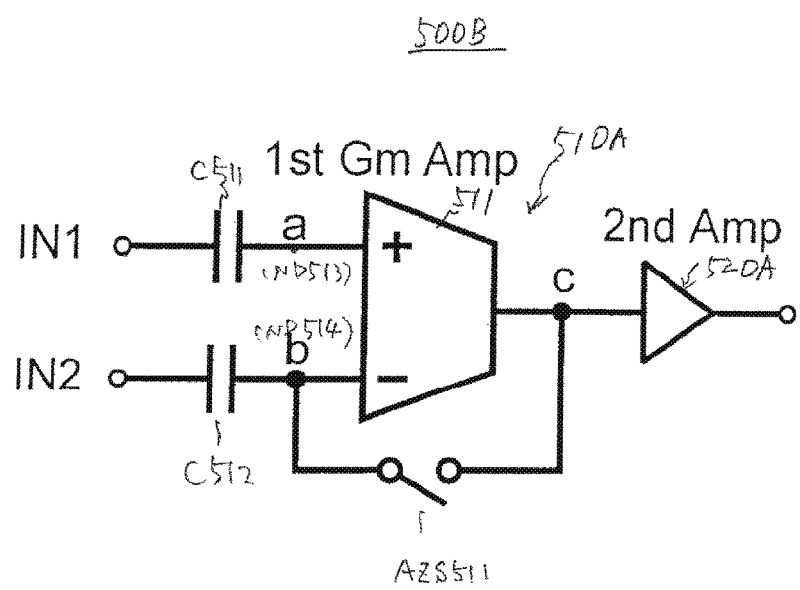
FIG. 24 A diagram showing the basic concept of a comparator having no isolator as a comparison example of the comparator shown in FIG. 23.

FIG. 24 is a diagram showing the basic concept of a comparator having no isolator as a comparison example of the comparator shown in FIG. 23.

The comparator 500A according to the embodiment has a first amplifier 510A including sampling capacitances C511 and C512 of an auto zero level, an auto zero switch AZS511 and a first-stage transconductance (Gm) amplifier 511, and a second amplifier 520A following the first amplifier 510A.

Then, the comparator 500A according to the embodiment is different from the comparator 500B shown in FIG. 24 as the comparative example in that it includes the isolator 530 arranged on at least the side of the output node of the first amplifier 510A and used for reducing a voltage fluctuation.

Note that FIGS. 23 and 24 show only the second amplifier on the subsequent stage of the first amplifier 510A, but the number of amplifiers is not limited.

Further, in the following description, the node ND 513 on one input side of the first amplifier 510A will be regarded as a node a, and the node ND514 on the other input side thereof will be regarded a node b. Moreover, the output part of the Gm amplifier 511 of the first amplifier 510A will be regarded as a node c, and the output node ND512 of the first amplifier 510A will be regarded as a node d.

The node c of the output part of the differential comparison part (Gm amplifier) 511 of the first amplifier 510A corresponds to the drain terminal of the NMOS transistor NT512 of the first amplifier 510 in the comparator 500 shown in FIG. 22.

The isolator 530 isolates the voltage of the output node c of the first-stage Gm amplifier 511 from the large-amplitude voltage node d and keeps the same at a constant level as much as possible.

The auto zero switch AZS511 is connected between the output node d of the isolator 530 and the high impedance node b.

[Waveforms Generated when Slope Signal is Input]

Here, consideration is given to a case where a fixed input signal is input to one input (IN2) of the comparator and a slope signal is input to the other input (IN1) thereof. Here, the slope signal refers to a signal whose signal level increases or decreases with a certain inclination as in the case of RAMP waveforms.

Figure 25:
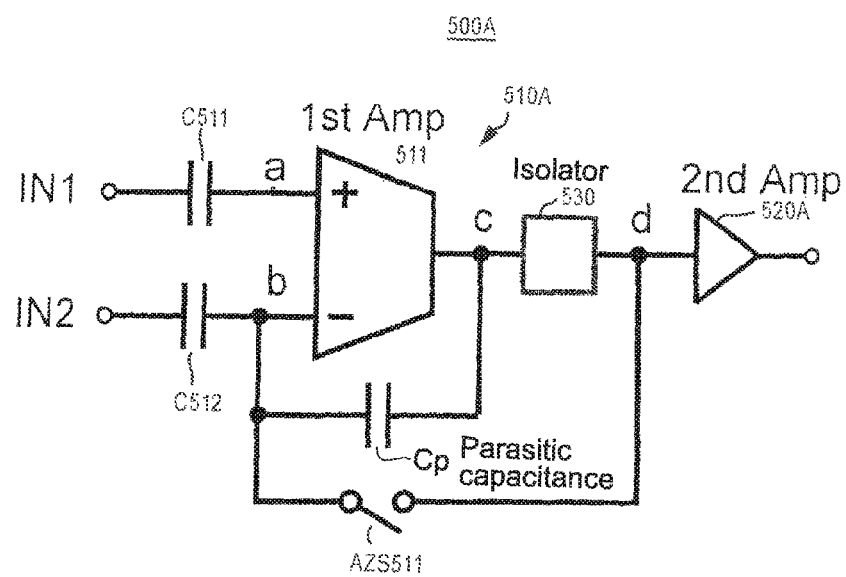
FIG. 25 A diagram showing an example where a parasitic capacitance exists between the input node and the output node of the Gm amplifier of the comparator according to the embodiment shown in FIG. 23.

FIG. 25 is a diagram showing an example where a parasitic capacitance exists between the input node and the output node of the Gm amplifier of the comparator according to the embodiment shown in FIG. 23.

FIGS. 26(A) to (D) are diagrams showing the parasitic capacitance and the waveforms of the respective nodes generated when the slope signal is input in the configuration example shown in FIG. 25.

Figure 27:
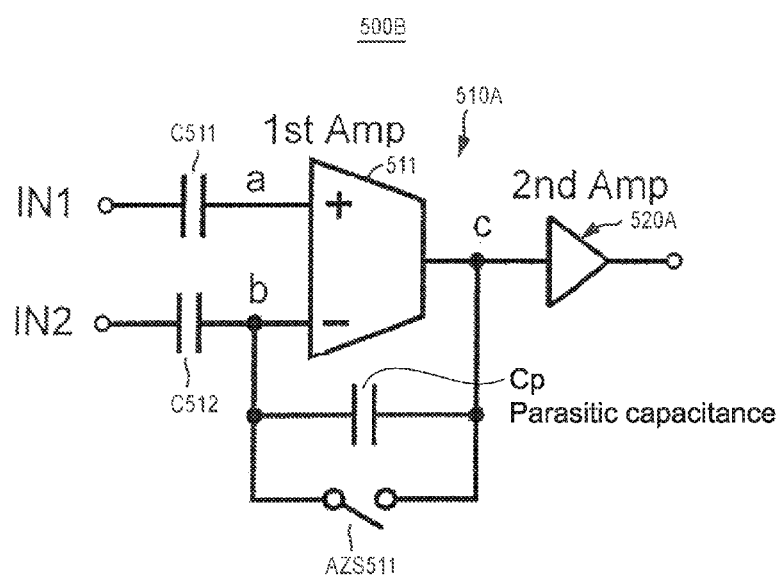
FIG. 27 A diagram showing an example where a parasitic capacitance exists between the input node and the output node of the Gm amplifier as the comparison example shown in FIG. 24.

FIG. 27 is a diagram showing an example where a parasitic capacitance exists between the input node and the output node of the Gm amplifier as the comparison example shown in FIG. 24.

FIGS. 28(A) to (D) are diagrams showing the parasitic capacitance and the waveforms of the respective nodes generated when the slope signal is input in the configuration example shown in FIG. 27.

Figure 26:
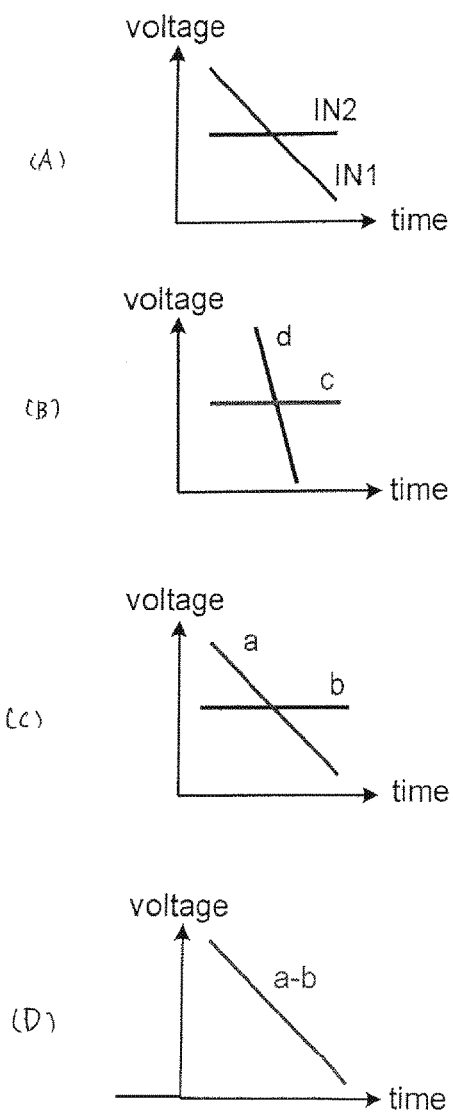
FIG. 26 Diagrams showing the parasitic capacitance and the waveforms of the nodes generated when the slope signal is input in the configuration example shown in FIG. 25.

When the fixed input signal and the slope signal are input to the one input (IN2) and the other input (IN1), respectively, of the comparator 500A according to the embodiment, the node d has a waveform of an extremely larger slope than the input slope signal as shown in FIG. 26(B).

However, the isolator 530 keeps the voltage of the output node c of the first-stage Gm amplifier 511 at a constant level.

Accordingly, even if the parasitic capacitance Cp exists between the node b and the node c, the node b is kept at a constant voltage without suffering from disturbance as shown in FIG. 26(C).

Accordingly, as shown in FIG. 26(D), the input slope (IN1) is directly applied as the differential input signal (a-b) of the first-stage Gm amplifier 511 of the comparator 500A.

On the other hand, in the configuration of the comparator 500B of the comparative example, the node c has a waveform of an extremely large slope as shown in FIG. 28(B).

Figure 7:
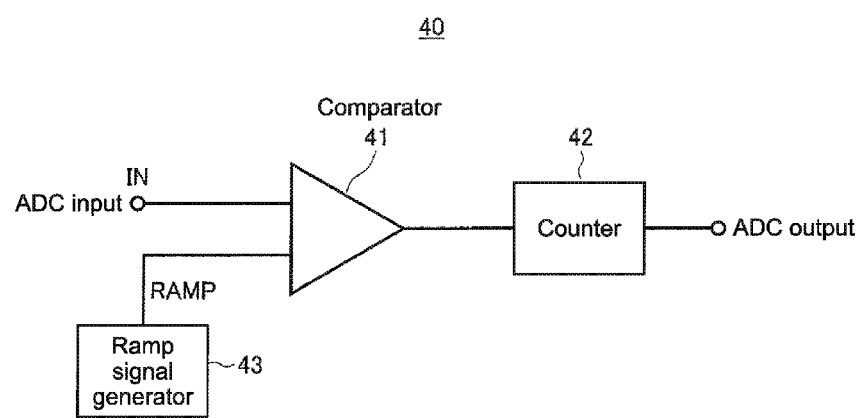
FIG. 7 A diagram showing the configuration of a general single slope AD converter.
Figure 8:
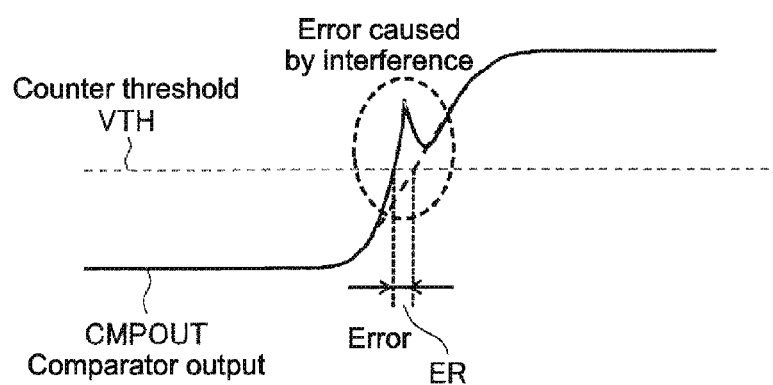
FIG. 8 A diagram showing the influence of the error caused when the adjacent TCVs interfere with the signals.

Thus, the slope is provided to the node b through the parasitic capacitance Cp existing between the node b and the node c (FIG. 7).

As a result, as shown in FIG. 28(D), the slope of the differential input signal (a-b) of the first-stage Gm amplifier of the comparator 500B is largely reduced compared with the input slope (IN1).

[Noise Reduction]

Next, consideration is given to noise reduction.

Figure 29:
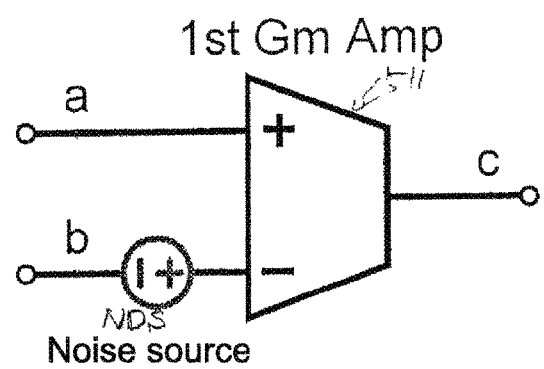
FIG. 29 A diagram for explaining the noise source of the first-stage Gm amplifier of the comparator.

FIG. 29 is a diagram for explaining the noise source of the first-stage Gm amplifier of the comparator.

Figure 30:
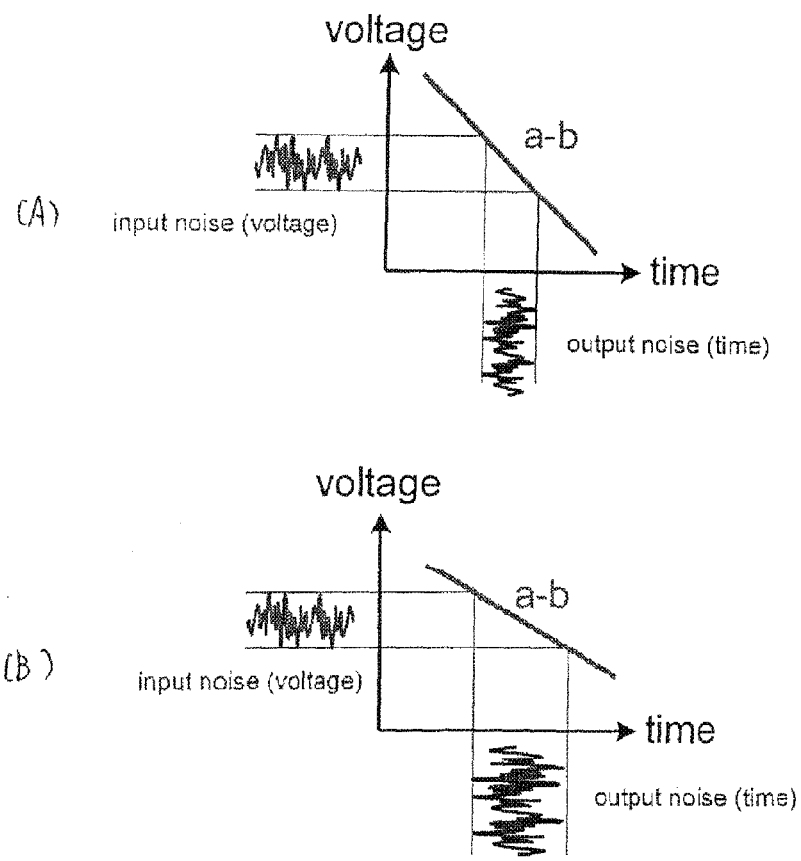
FIG. 30 Diagrams showing an example of converting voltage noise into time noise.

FIGS. 30(A) and (B) are diagrams showing an example of converting voltage noise into time noise.

In the first-stage Gm amplifier 511 of the comparators 500A and 500B, a constant input conversion noise source exists. As shown in FIG. 29, the noise source can be described as the input conversion noise source NOS.

When the fixed input signal and the slope signal (waveform) are input to one input (IN2) and the other input (IN1), respectively, of the comparators 500A and 500B, the above voltage noise is converted in the manner as shown in FIGS. 30(A) and (B).

That is, the slope of the differential input signal (a-b) of the first-stage Gm amplifier 511 is converted into time-axis noise (i.e., jitter) as a conversion gain.

Accordingly, with the attenuation of the slope of the differential input signal (a-b), the output noise of the comparators 500A and 500B is increased.

As described above, the comparator 500A of this configuration reduces the attenuation of the slope as shown in FIG. 30(A). As a result, the output noise of the comparator 500A is reduced.

Note that the operation of the first-stage Gm amplifier 511 of the comparator 500A is accelerated with an increase in the slope of the differential input signal (a-b).

That is, because the band of the comparator 500A also increases, the contribution of the increase in the slope of the differential input signal (a-b) is smaller than direct proportion as for noise such as thermal noise reaching high frequency.

On the other hand, the contribution of the increase in the slope of the differential input signal (a-b) is close to direct proportion as for low-frequency noise such as flicker noise and RTS noise. That is, the present technology is particularly effective for the reduction of such the low-frequency noise.

<3.3 Specific Circuit Configuration Example of Comparator Capable of Reducing Low-Frequency Noise>

First Circuit Configuration Example

Figure 31:
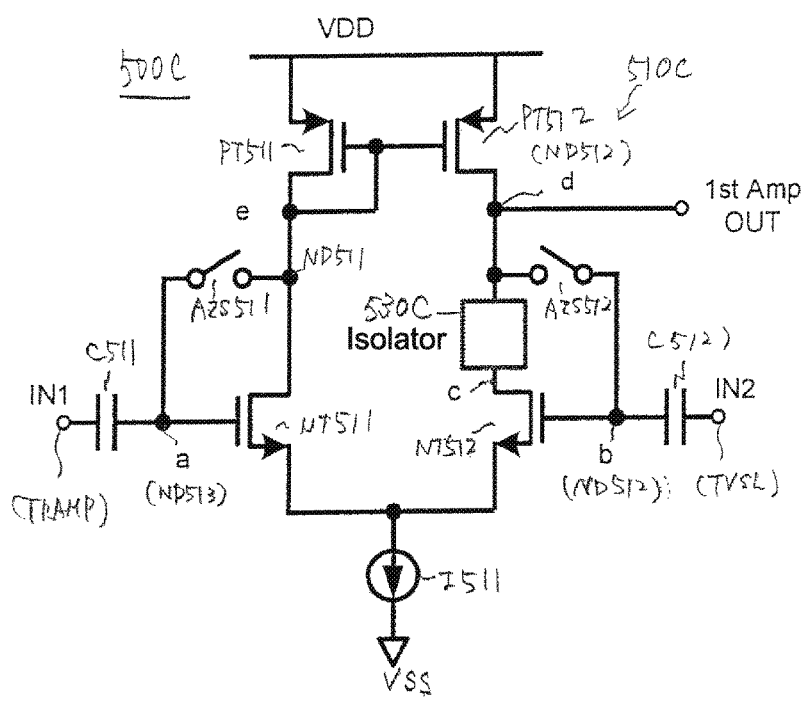
FIG. 31 A diagram showing a first circuit configuration example of a comparator capable of reducing low-frequency noise according to the embodiment.

FIG. 31 is a diagram showing a first circuit configuration example of a comparator capable of reducing low-frequency noise according to the embodiment.

The comparator 500C shown in FIG. 31 is so configured as to have an isolator 530C between the output node ND512 and the drain terminal (output terminal) of the NMOS transistor NT512 forming an NMOS differential pair (Gm amplifier) in the first amplifier 510 of the comparator 500 shown in FIG. 22.

Note that in FIG. 31, the PMOS transistors PT513 and PT514 serving as auto zero switches shown in FIG. 22 are indicated as auto zero switches AZS511 and AZS512, and the NMOS transistor NT513 is indicated as a power supply 1511.

In the case of the comparator 500C shown in FIG. 31, the parasitic capacitance Cp shown in FIG. 25 is mainly formed by a capacitance Cgd existing between the gate and the drain of the NMOS transistor NT512 of the NMOS differential pair and by a parasitic capacitance existing between metal wirings.

Second Circuit Configuration Example

Figure 32:
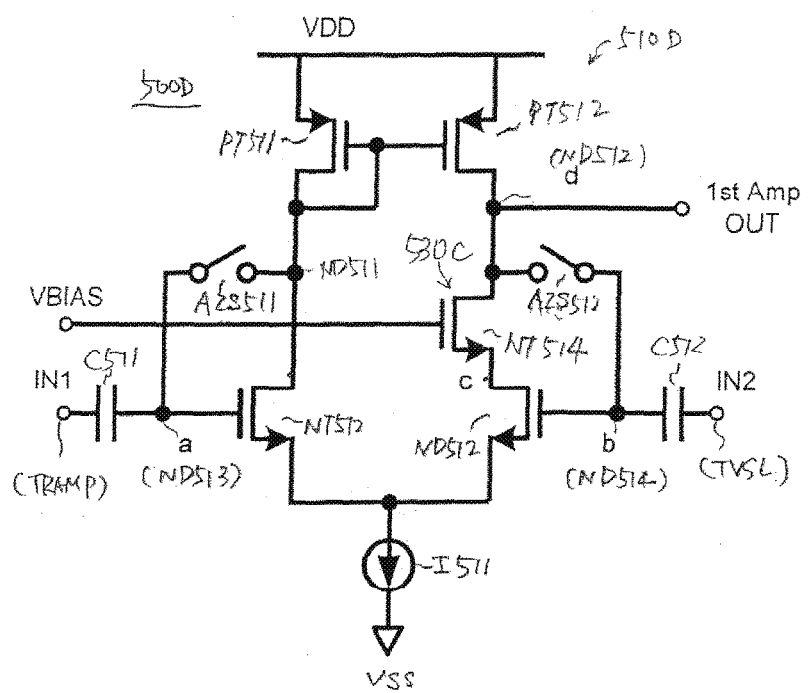
FIG. 32 A diagram showing a second circuit configuration example of the comparator capable of reducing low-frequency noise according to the embodiment.

FIG. 32 is a diagram showing a second circuit configuration example of a comparator capable of reducing low-frequency noise according to the embodiment.

In the comparator 500D shown in FIG. 32, the isolator 530C of the comparator 500C shown in FIG. 31 is formed by an NMOS transistor NT514.

The drain of the NMOS transistor NT514 is connected to an output node ND512(d) of a first amplifier 510D, and the source thereof is connected to the drain (node c) of the NMOS transistor NT512 forming a Gm amplifier.

Further, in the comparator 500D shown in FIG. 32, the gate of the NMOS transistor NT514 forming the isolator 530C is connected to the supply line of a bias voltage VBIAS.

Thus, a constant current flows through the NMOS transistor NT514. Therefore, even if a parasitic capacitance exists between the gate (input node b) and the drain (output node c) of the NMOS transistor NT512, it is possible to suppress a voltage fluctuation and reduce low-frequency noise.

Note that the transistor used for the isolation is not limited to the same type as the differential pair transistor.

Third Circuit Configuration Example

Figure 33:
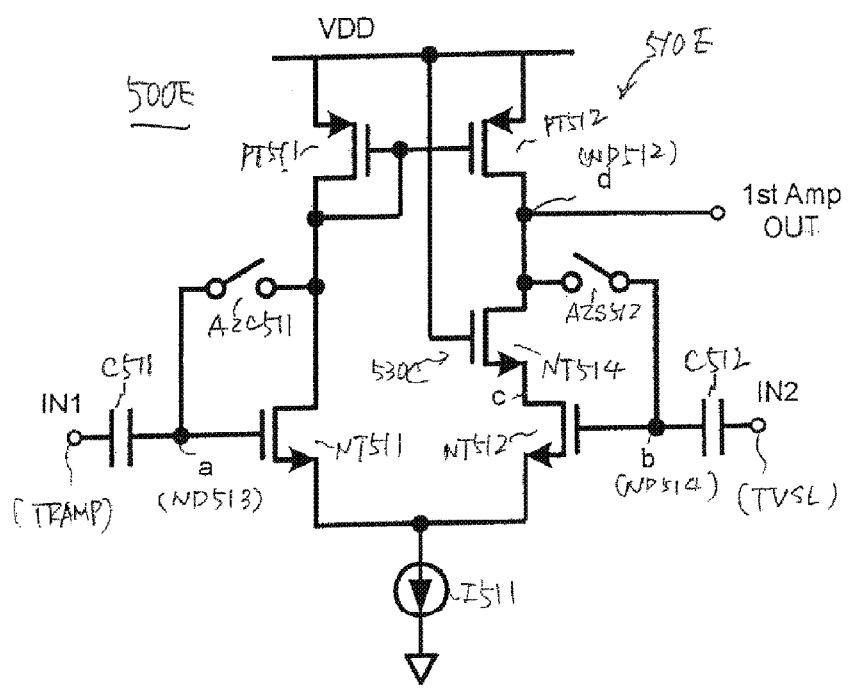
FIG. 33 A diagram showing a third circuit configuration example of the comparator capable of reducing low-frequency noise according to the embodiment.

FIG. 33 is a diagram showing a third circuit configuration example of a comparator capable of reducing low-frequency noise according to the embodiment.

The comparator 500E shown in FIG. 33 is different from the comparator 500D shown in FIG. 32 in that the gate of the NMOS transistor NT514 serving as the isolator 530C is connected to a power supply voltage source VDD rather than being connected to the supply line of the bias voltage VBIAS.

The comparator 500D shown in FIG. 32 uses another bias voltage VBIAS to operate the NMOS transistor NT514.

For example, when the comparator is used in a column-parallel single slope AD converter in the application of a CMOS image sensor or the like, there are some concerns in the use of the bias voltage VBIAS as follows:
  (1) Interference between columns
  (2) Increase in VBIAS wiring region
  (3) Use of VBIAS generation circuit.

On the other hand, the comparator 500E shown in FIG. 33 where the gate of the NMOS transistor NT514 is connected to the power supply voltage source VDD is free from such concerns, and is particularly suitable for realizing a column-parallel single slope AD converter.

Fourth Circuit Configuration Example

Figure 34:
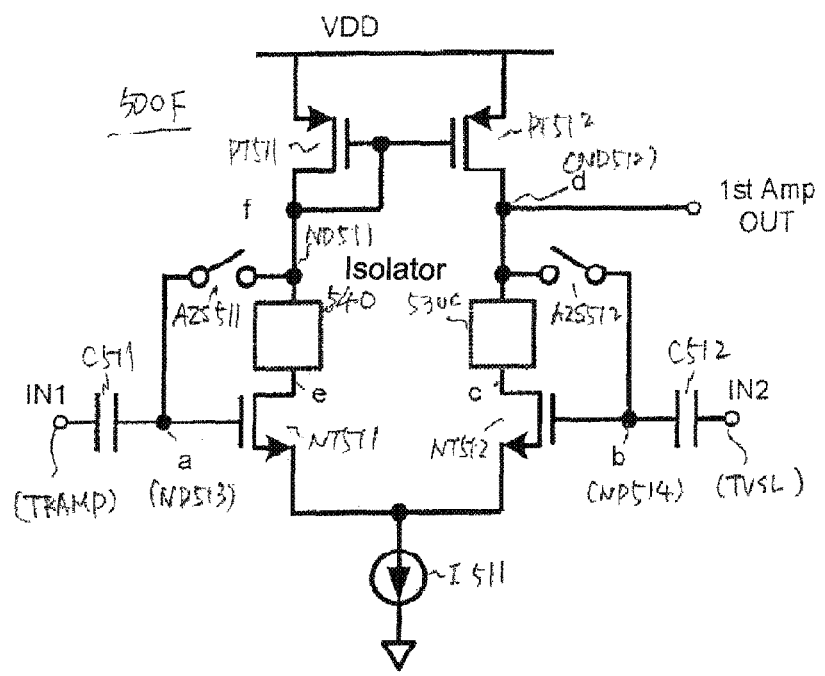
FIG. 34 A diagram showing a fourth circuit configuration example of the comparator capable of reducing low-frequency noise according to the embodiment.

FIG. 34 is a diagram showing a fourth circuit configuration example of a comparator capable of reducing low-frequency noise according to the embodiment.

The comparator 500F shown in FIG. 34 is different from the comparator 500C shown in FIG. 31 in the following point.

The comparator 500F additionally has a second isolator 540 between the node (node f) ND511 on a load side and the drain terminal (node e) of the NMOS transistor NT511 forming an NMOS differential pair (Gm amplifier).

Because the node e has low impedance due to a diode-connected PMOS load, i.e., the node e is kept at a nearly constant voltage, the contribution of the isolation to the node e is small.

As a result, the isolation may or may not be performed on the node e.

However, the comparator 500F shown in FIG. 34 has high circuit symmetry. Therefore, the comparator 500F having an auto zero function can realize a comparison operation with higher precision.

Fifth Circuit Configuration Example

Figure 35:
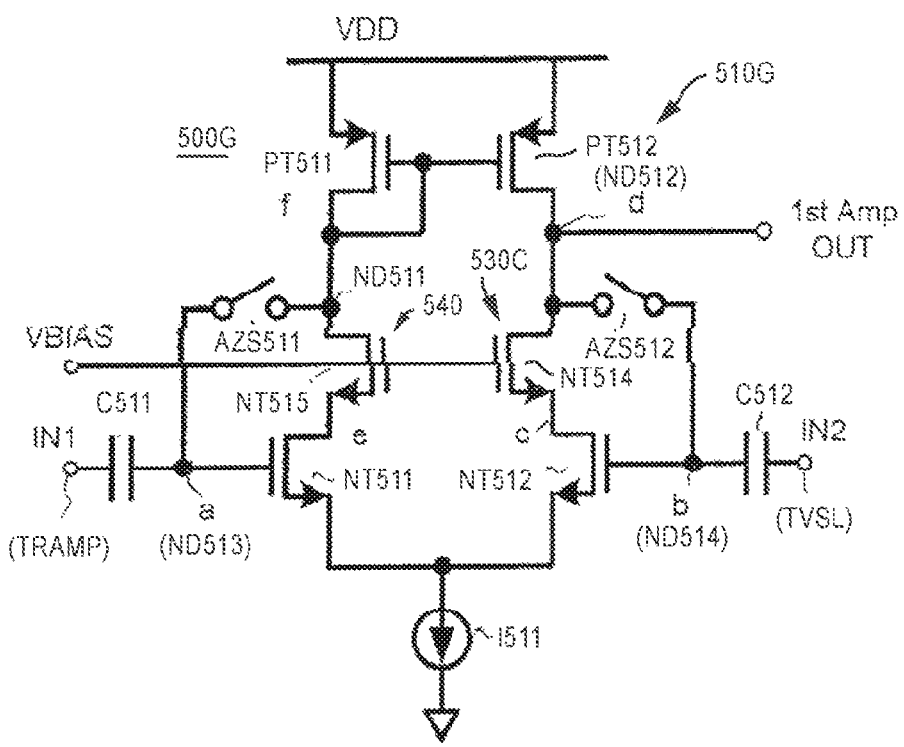
FIG. 35 A diagram showing a fifth circuit configuration example of the comparator capable of reducing low-frequency noise according to the embodiment.

FIG. 35 is a diagram showing a fifth circuit configuration example of a comparator capable of reducing low-frequency noise according to the embodiment.

In the comparator 500G shown in FIG. 35, the isolator 540 of the comparator 500F shown in FIG. 34 is formed by an NMOS transistor NT515.

The drain of the NMOS transistor NT515 is connected to the node ND511 (node f) on the load side of a first amplifier 510G, and the source thereof is connected to the drain (node e) of the NMOS transistor NT511 forming the Gm amplifier.

Further, in the comparator 500G shown in FIG. 35, the gate of the NMOS transistor NT514 forming the isolator 530C and the gate of an NMOS transistor NT515 forming the isolator 540 are connected to the supply line of the bias voltage VBIAS.

Thus, a constant current flows through the NMOS transistor NT514. Therefore, even if a parasitic capacitance exists between the gate (input node b) and the drain (output node c) of the NMOS transistor NT512, it is possible to suppress a voltage fluctuation and reduce low-frequency noise.

Similarly, a constant current flows through the NMOS transistor NT515. Therefore, even if a parasitic capacitance exists between the gate (input node a) and the drain (output node e) of the NMOS transistor NT511, it is possible to suppress a voltage fluctuation and reduce low-frequency noise.

Also in this case, a transistor used for isolation is not limited to a differential pair transistor.

Sixth Circuit Configuration Example

Figure 36:
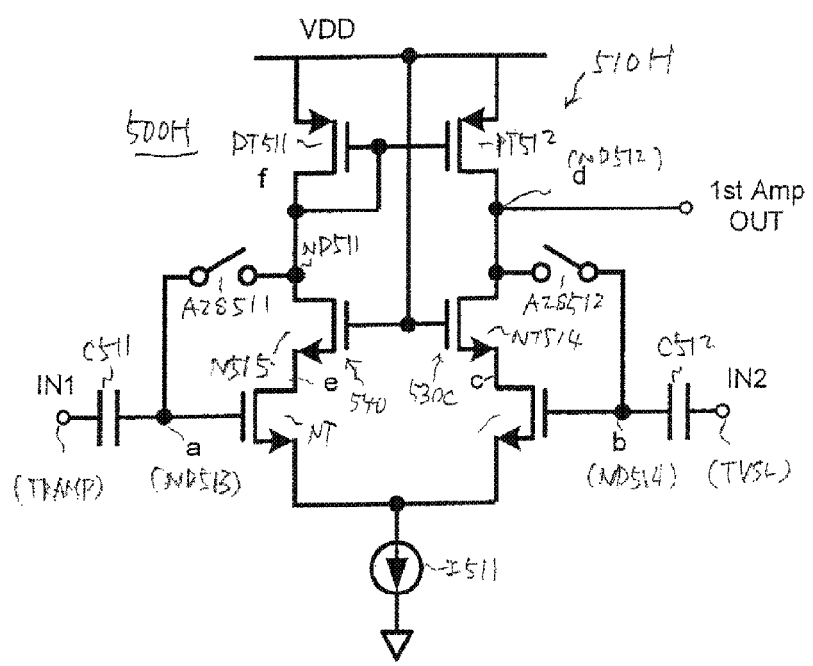
FIG. 36 A diagram showing a sixth circuit configuration example of the comparator capable of reducing low-frequency noise according to the embodiment.

FIG. 36 is a diagram showing a sixth circuit configuration example of a comparator capable of reducing low-frequency noise according to the embodiment.

The comparator 500H shown in FIG. 36 is different from the comparator 500G shown in FIG. 35 in the following point.

In the comparator 500H, the gate of the NMOS transistor NT514 serving as the isolator 530C and the gate of the NMOS transistor NT515 serving as the isolator 540 are connected to the power supply voltage source VDD rather than being connected to the supply line of the bias voltage VBIAS.

The comparator 500G shown in FIG. 35 uses another bias voltage VBIAS to operate the NMOS transistors NT514 and NT515.

For example, as in the case of the third circuit configuration example, when the comparator is used in a column-parallel single slope AD converter in the application of a CMOS image sensor or the like, there are some concerns in the use of the bias voltage VBIAS as follows:
  (1) Interference between columns
  (2) Increase in VBIAS wiring region
  (3) Use of VBIAS generation circuit.

On the other hand, the comparator 500H shown in FIG. 36 where the gates of the NMOS transistors NT514 and NT515 are connected to the power supply voltage source VDD is free from such concerns, and is particularly suitable for realizing a column-parallel single slope AD converter.

Effective Mounting Example

Here, a description will be given of an effective mounting example of a comparator capable of reducing low-frequency noise according to the embodiment.

FIGS. 37(A) and 37(B) are diagrams for explaining an effective mounting example of a comparator capable of reducing low-frequency noise according to the embodiment.

As shown in FIG. 37(A), this mounting example refers to the case of the comparator 500H shown in FIG. 36 having high asymmetry.

Figure 37:
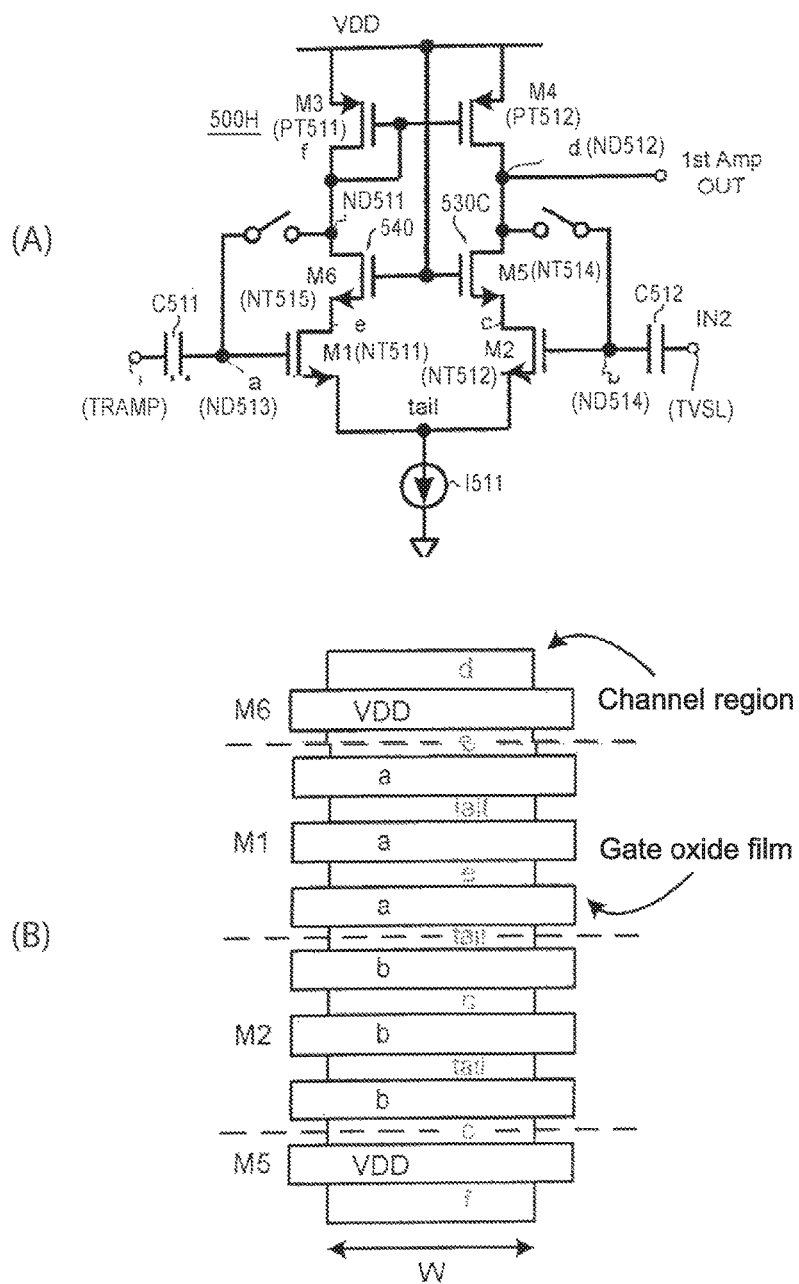
FIG. 37 Diagrams for explaining an effective mounting example of the comparator capable of reducing low-frequency noise according to the embodiment.

In FIG. 37, the NMOS differential pair transistors NT511 and NT512 are represented as M1 and M2, respectively. Further, the transistors NT514 and NT515 for the isolation are represented as M5 and M6, respectively.

The channel widths W of the differential pair transistors M1 and M2 are set to be equal to those of the transistors M5 and M6 for the isolation. In addition, the number of fingers of the differential pair transistors M1 and M2 is set to an odd number. Thus, the transistors M5 and M6 for the isolation and the differential pair transistors M1 and M6 can share a channel region.

As a result, the channel regions on the both sides of the differential pair transistors M1 and M2 are naturally expanded.

It has been known that low-frequency noise such as flicker noise and RTS noise can be improved with such a mounting method (Non-Patent Document 1).

Accordingly, with the mounting of the present technology, low-frequency noise can be improved according to the above two mechanisms (circuit operation and process characteristics).

[Non-Patent-Document 1]
"Impact of STA Effect on Flicker Noise in 0.13 μm RF nMOSFETs" IEEE TRANSACTIONS ON ELECTRON DEVICES, VOL. 54, NO. 12, DECEMBER 2007, pp. 3383-3392

As described above, the embodiment can present the following effects.

According to the present technology, it is possible to reduce the number of the TCVs compared with an existing laminated structure without causing the error in transmitting the signals. Further, no circuits such as the quantizers (comparators) may be provided in the analog chip. Therefore, the area of the analog chip can be reduced to such an extent as to be determined by only the sensors.

For example, the area of the sensors (pixels) is determined by the optical size of the system in the image sensor. Therefore, the area of the analog chip can be reduced to a nearly limit size at which the analog chip is minimized.

As described above, the analog chip has more manufacturing steps compared with the logic chip (digital chip). Therefore, even if the area of the analog chip is the same as that of the logic chip, the analog chip is higher in cost than the logic chip.

Further, because the circuits are arranged at only the parts related to the sensors in the analog chip according to the present technology, it is possible to eliminate a wiring step and a transistor manufacturing step. In general, the transistors for manufacturing the circuits such as the comparators and the transistors for constituting the sensors are manufactured in steps including an uncommon step. Accordingly, the elimination of the circuits such as the comparators can reduce such manufacturing steps.

Similarly, because no complicated wirings have to be provided in the analog chip, the number of the wirings can be reduced.

From the two reasons above, the present technology makes it possible to largely reduce a cost for manufacturing the semiconductor apparatus without degrading the signals output from the sensors.

Further, as described above, the comparators 500C to 500H according to the embodiment have a configuration that reduces noise with the cascode transistors.

According to these configurations, the output node and the input node are paired to make comparison with a slope signal, e.g., a lamp signal, thereby preventing an effective input signal amplitude from being attenuated. As a result, it is possible to reduce the input conversion noise of the comparators.

As described above, it is possible to reduce noise, particularly low-frequency noise such as flicker noise and RTS noise in the comparators with the auto zero function and the single slope AD converters and the solid-state image sensing apparatuses using the comparators.

Note that the comparators having such characteristics produce a higher effect of noise reduction when being applied to the second chip serving as the digital chip of the laminated structure shown in FIG. 9.

However, when the comparators are mounted on the first chip serving as the analog chip, they also produce a high effect of noise reduction even in the case of a circuit configuration having no laminated structure.

Further, as described above, it is possible to reduce noise, particularly low-frequency noise such as flicker noise and RTS noise in the single slope AD converters and the solid-state image sensing apparatuses using the comparators with the auto zero function.

Note that the embodiment describes the configurations of the CMOS image sensors as an example of the semiconductor apparatuses. In addition, the above configurations can be applied to, for example, backside illumination CMOS image sensors to achieve the above effects. However, the above effects can also be substantially achieved when the configurations are applied to front side illumination CMOS image sensors.

Solid-state image sensing apparatus having such configurations can be applied as the image sensing devices of digital cameras and video cameras.

<4. Configuration Example of Camera System>

Figure 38:
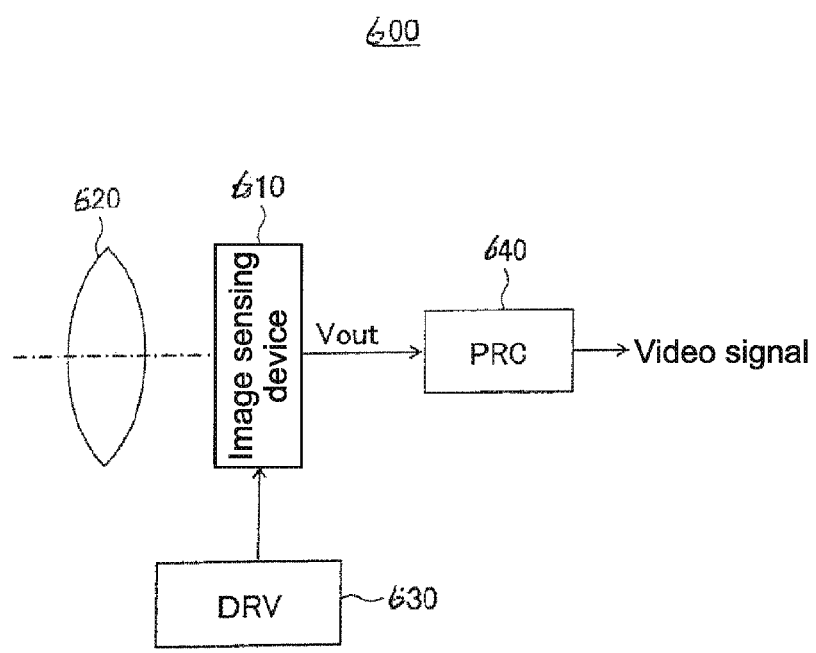
FIG. 38 A diagram showing an example of the configuration of a camera system to which the solid-state image sensing apparatus according to the embodiment is applied.

FIG. 38 is a diagram showing an example of the configuration of a camera system to which the solid-state image sensing apparatus according to the embodiment is applied.

As shown in FIG. 38, the camera system 600 has an image sensing device 610 to which the CMOS image sensors (solid-state image sensing apparatuses) 200, 300, and 300A to 300C according to the embodiment can be applied.

Moreover, the camera system 600 has an optical system that guides incident light (forms a subject image on) to the pixel region of the image sensing device 610, e.g., a lens 620 that forms an image of incident light (image light) on an image sensing surface.

The camera system 600 has a drive circuit (DRV) 630 that drives the image sensing device 610 and a signal processing circuit (PRC) 640 that processes signals output from the image sensing device 610.

The drive circuit 630 has a timing generator (not shown) that generates various timing signals including a start pulse and a clock pulse for driving circuits inside the image sensing device 610. Based on a predetermined timing signal, the drive circuit 630 drives the image sensing device 610.

Further, the signal processing circuit 640 applies predetermined signal processing to the signals output from the image sensing device 610.

The image signals processed by the signal processing circuit 640 are recorded on, for example, a recording medium such as a memory. The image information recorded on the recording medium is hard-copied by a printer or the like. Further, the image signals processed by the signal processing circuit 640 are displayed as moving pictures on a monitor composed of a liquid crystal display or the like.

As described above, the installation of any of the solid-state image sensing apparatuses 200, 300, and 300A to 300C as the image sensing device 610 in an image sensing apparatus such as a digital still camera can realize a high-precision camera.

Note that the present disclosure may also employ the following configurations.

(1) A semiconductor apparatus, including:
a first chip having a plurality of sensors arranged in array form; and
a second chip, in which
the first chip and the second chip are bonded together to form a laminated structure,
a wiring between the first chip and the second chip is connected through via holes,
the first chip transmits signals obtained by time-discretizing analog signals generated by the respective sensors to the second chip through the corresponding via holes, and
the second chip has
a function of sampling the signals transmitted from the first chip through the via holes at a timing different from a timing at which the signals are sampled by the first chip and
a function of quantizing the sampled signals to obtain digital signals.

(2) The semiconductor apparatus according to (1), in which
the second chip samples the signals transmitted from the first chip through the via holes at the timing different from the timing at which the signals are sampled by the first chip, and quantizes the sampled signal to obtain the digital signals.

(3) The semiconductor apparatus according to (1), in which
the second chip includes quantizers for use in continuous-time quantization and samples the signals quantized by the quantizers at the timing different from the timing at which the signals are sampled by the first chip, the signals being transmitted from the first chip through the via holes.

(4) The semiconductor apparatus according to (1), in which
the second chip includes
comparators that compare the signals transmitted from the first chip through the via holes with a ramp signal and output signals based on the comparison result and
counters of which operations are controlled by outputs of the comparators, the counters counting comparison times of the corresponding comparators to perform quantization.

(5) The semiconductor apparatus according to any one of (1) to (4), in which
the via holes that transmit the analog signals between the first chip and the second chip and the via holes that transmit the digital signals therebetween are arranged so as to be concentrated and separated from each other.

(6) A solid-state image sensing apparatus, including:
a pixel array part having a plurality of pixels arranged in matrix form, the pixels performing photoelectric conversion; and
a pixel signal reading part that reads time-discretized pixel signals in units of the plurality of pixels from the pixel array part,
the pixel signal reading part having
a plurality of comparators that are arranged corresponding to an arrangement of columns of the pixels, compare a reading signal potential with a ramp signal, and output signals based on the comparison result, and
a plurality of counters of which operations are controlled by outputs of the comparators, the counters counting comparison times of the corresponding comparators to perform quantization,
a first chip, and
a second chip, in which
the first chip and the second chip are bonded together to form a laminated structure,
the first chip has the pixel array part and signal lines that transmit time-discretized analog pixel signals,
the second chip has the pixel signal reading part, and
the first chip and the second chip have a wiring connected therebetween through via holes.

(7) The solid-state image sensing apparatus according to (6), in which
the via holes that transmit the analog signals between the first chip and the second chip and the via holes that transmit the digital signals therebetween are arranged so as to be concentrated and separated from each other.

(8) A camera system, including:
a solid-state image sensing apparatus; and
an optical system that forms a subject image on the solid-state image sensing apparatus, in which
the solid-state image sensing apparatus includes
a pixel array part having a plurality of pixels arranged in matrix form, the pixels performing photoelectric conversion, and
a pixel signal reading part that reads time-discretized pixel signals in units of the plurality of pixels from the pixel array part,
the pixel signal reading part having
a plurality of comparators that are arranged corresponding to an arrangement of columns of the pixels, compare a reading signal potential with a ramp signal, and output signals based on the comparison result,
a plurality of counters of which operations are controlled by outputs of the comparators, the counters counting comparison times of the corresponding comparators to perform quantization,
a first chip, and
a second chip,
the first chip and the second chip being bonded together to form a laminated structure,
the first chip having the pixel array part and signal lines that transmit time-discretized analog pixel signals,
the second chip having the pixel signal reading part,
the first chip and the second chip having a wiring connected therebetween through via holes.

(9) The camera system according to (8), in which
the via holes that transmit the analog signals between the first chip and the second chip and the via holes that transmit the digital signals therebetween are arranged so as to be concentrated and separated from each other.

DESCRIPTION OF REFERENCE NUMERALS 100, 100A to 100G semiconductor apparatus
110, 110A to 110G first chip (analog chip)
111 (-0, -1, . . . ) sensor
112 (-0, -1, . . . ) sample hold (SH) circuit
113 (-0, -1, . . . ) amplifier
114 (-0, -1, . . . ) TCV (via hole)
115 (-0, -1, . . . ) sampling switch
120, 120A to 120G second chip (logic chip, digital chip)
121 (-0, -1, . . . ) sampling switch
122 (-0, -1, . . . ) quantizer
123 signal processing circuit
124 (-0, -1, . . . ) comparator
125 (-0, -1, . . . ) counter
200 solid-state image sensing apparatus
210 pixel array part
220 row selection circuit
230 column reading circuit
300, 300A to 300C solid-state image sensing apparatus
310 pixel array part
320 row selection circuit
330 horizontal transfer scanning circuit
340 timing control circuit
350 ADC group
360 DAC (ramp signal generator)
370 amplifier circuit (S/A)
380 signal processing circuit
390 horizontal transfer line
410, 420 region where TCVs for transmitting digital signals are arranged
430 region where TCVs for transmitting analog signals are arranged
500, 500A to 500H comparator
510, 510A to 510C first amplifier
511 Cm amplifier
520 second amplifier
530, 530C isolator (first isolator)
540 isolator (second isolator)
600 camera system
610 image sensing device
620 lens
630 drive circuit
640 signal processing circuit

The invention claimed is:
1. An imaging device comprising:
a first substrate including:
a plurality of pixels, a pixel of the plurality of pixels being configured to output an analog signal, and
a plurality of signal lines, a signal line of the plurality of signal lines being coupled to the pixel; and
a second substrate including:
a plurality of comparators, a comparator of the plurality of comparators being coupled to the first signal line and including:
a first amplifier having a first transistor configured to receive a signal based on the analog signal, a second transistor configured to receive a reference signal, and an output node coupled to the first transistor,
a second amplifier having an input transistor configured to receive an output signal from the output node, and
a capacitor coupled the output node and the input transistor.

2. The imaging device according to claim 1, wherein the capacitor is disposed between the output node and second amplifier.

3. The imaging device according to claim 1, wherein a gate of the input transistor is coupled to the capacitor.

4. The imaging device according to claim 1, wherein the first transistor and the second transistor have a first conductivity type.

5. The imaging device according to claim 4, wherein the input transistor has a second conductivity type.

6. The imaging device according to claim 1, wherein the capacitor is coupled between the first amplifier and the second amplifier.

7. The imaging device according to claim 1, wherein the second amplifier has an input node coupled to the capacitor.

8. The imaging device according to claim 1, wherein a first terminal of the input transistor is configured to receive a predetermined voltage.

9. The imaging device according to claim 8, wherein a second terminal of the input transistor is coupled to the capacitor.

10. The imaging device according to claim 9, wherein the predetermined voltage is a power source voltage.

11. The imaging device according to claim 1, wherein a gate of the input transistor is configured to receive an output signal from the output node.

12. An imaging device comprising:
a first substrate including:
a pixel array unit including a plurality of pixels, a pixel of the plurality of pixels being configured to receive an incident light and output an analog signal, and
a plurality of signal lines, a signal line of plurality of signal lines being coupled to the pixel; and
a second substrate including:
a plurality of comparators, and
a plurality of counters,
wherein a comparator of the plurality of comparators includes a first amplifier, a second amplifier, and a capacitor,
wherein the first amplifier receives a reference signal and the analog signal,
wherein the capacitor is coupled to the first amplifier and the second amplifier, and
wherein the second amplifier is coupled to a counter of the plurality of counters.

13. The imaging device according to claim 12, wherein the first amplifier is configured to compare the reference signal and the analog signal.

14. The imaging device according to claim 12, wherein the pixel is coupled to at least one selected from a floating diffusion, a reset transistor, an amplification transistor, and/or a selection transistor.

15. The imaging device according to claim 12, wherein the first amplifier includes a first transistor and a second transistor, a gate of the first transistor being configured to receive the reference signal and a gate of the second transistor being configured to receive the analog signal.

16. The imaging device according to claim 12, wherein the second amplifier includes a third transistor, a gate of the third transistor being configured to receive an output signal from the first amplifier.

17. The imaging device according to claim 16, wherein the capacitor is coupled the gate of the third transistor and one of a drain or a source of the third transistor.

18. The imaging device according to claim 12, wherein the pixel includes a photodiode and a transfer transistor.

19. The imaging device according to claim 12, wherein the first substrate and the second substrate are bonded to each other.

20. The imaging device according to claim 12, wherein the second substrate includes at least a part of a control circuit.

21. An imaging device comprising:
a first substrate including:
    a plurality of pixels, a pixel of the plurality of pixels being configured to output an analog signal, and
    a plurality of signal lines, a signal line of the plurality of signal lines being coupled to the pixel; and
a second substrate including:
    a plurality of comparators, a comparator of the plurality of comparators being coupled to the signal line and including:
        a first circuit including a first transistor configured to receive a signal based on the analog signal, a second transistor configured to receive a reference signal, and an output node coupled to the first transistor,
        a second circuit including an input transistor configured to receive an output signal from the output node, and
        a capacitor coupled the output node and the input transistor.

22. The imaging device according to claim 21, wherein the capacitor is disposed between the output node and the second amplifier.

23. The imaging device according to claim 21, wherein a gate of the input transistor is coupled to the capacitor.

24. The imaging device according to claim 21, wherein the first transistor and the second transistor have a first conductivity type.

25. The imaging device according to claim 24, wherein the input transistor has a second conductivity type.

26. The imaging device according to claim 21, wherein the capacitor is coupled between the first amplifier and the second amplifier.

27. The imaging device according to claim 21, wherein the second amplifier has an input node coupled to the capacitor.

28. The imaging device according to claim 21, wherein a first terminal of the input transistor configured to receive a predetermined voltage.

29. The imaging device according to claim 28, wherein a second terminal of the input transistor is coupled to the capacitor.

30. The imaging device according to claim 29, wherein the predetermined voltage is a power source voltage.

* * * * *